(12) United States Patent  
Toyama et al.

(10) Patent No.: US 7,259,989 B2  
(45) Date of Patent: Aug. 21, 2007

(54) NON-VOLATILE MEMORY DEVICE

(75) Inventors: Masayuki Toyama, Neyagawa (JP); Tokuzo Kiyohara, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 65 days.

(21) Appl. No.: 11/204,316

(22) Filed: Aug. 16, 2005

(65) Prior Publication Data

US 2006/0050593 A1 Mar. 9, 2006

(30) Foreign Application Priority Data

Sep. 3, 2004 (JP) ............................. 2004-257278

(51) Int. Cl.
*G11C 16/04* (2006.01)
(52) U.S. Cl. ........................... 365/185.12; 365/185.13; 365/189.01
(58) Field of Classification Search ........... 365/185.12, 365/185.13, 189.01
See application file for complete search history.

(56) References Cited

U.S. PATENT DOCUMENTS

| | | | |
|---|---|---|---|
| 5,297,029 A | 3/1994 | Nakai et al. | |
| 5,706,243 A | 1/1998 | Mori | |
| 7,006,383 B2* | 2/2006 | Tanaka | 365/185.29 |
| 2003/0095437 A1 | 5/2003 | Imamiya | |
| 2004/0030823 A1 | 2/2004 | Honda et al. | |
| 2004/0090847 A1 | 5/2004 | Takeuchi et al. | |
| 2004/0145952 A1 | 7/2004 | Chen et al. | |
| 2005/0013169 A1* | 1/2005 | Tanake et al. | 365/185.22 |
| 2005/0144363 A1* | 6/2005 | Sinclair | 711/103 |

FOREIGN PATENT DOCUMENTS

| | | |
|---|---|---|
| JP | 61-243545 | 10/1986 |
| JP | 3392839 | 1/2003 |

* cited by examiner

*Primary Examiner*—Thong Q. Le
(74) *Attorney, Agent, or Firm*—Wenderoth, Lind & Ponack, L.L.P.

(57) ABSTRACT

A non-volatile memory device is disclosed that can reduce the time required for the initialization process. A non-volatile memory device includes a non-volatile memory array having a plurality of pages. Each page includes a plurality of non-volatile memory cells, a first region for storing data, and a second region for storing control data that is associated with the data of the first region. The non-volatile memory device further includes a read out unit for reading out data from the pages, and a data buffer for temporarily storing data that has been read out from the pages by the read out unit. When reading out the control data, the read out unit reads out the second regions, across a plurality of pages, at one time.

19 Claims, 19 Drawing Sheets

NON-VOLATILE MEMORY DEVICE

BACKGROUND OF THE INVENTION

1. Field of the Invention

The present invention relates to a non-volatile memory device whereby the time required for initialization can be reduced.

2. Background Information

The flash memory described in JP-3392839-B, for example, and particularly NAND-type flash memory, is structured so that writing and reading is performed in page units (between 512 bytes and 2048 bytes). FIGS. 16 and 17 show the structure of the NAND-type flash memory device 100, described in JP-3392839-B. The NAND-type flash memory device 100 comprises a non-volatile memory array 115, a sense amp 190, a data buffer 200, a column address buffer/decoder 210, a row address buffer/decoder 220, and a controller 300.

Within the non-volatile memory array 115, a plurality of non-volatile memory cells 170 are disposed at the intersections of word lines 129 and bit lines 139 that cross each other as shown in FIG. 17. Furthermore, the non-volatile memory array 115 includes a plurality of blocks 110, which are data erase units, the blocks 110 including a plurality of pages 120, which are data read and write units. Furthermore, each page 120 includes a first region 150 and a second region 160. Data that is read out to the exterior of the flash memory device 100, and data that is written from the exterior of the flash memory device 100, is stored in the first region 150. Meanwhile, data that is associated with the data of the first region 150 is stored in the second region 160.

The controller 300 accepts, from the exterior of the flash memory device 100, a variety of commands and addresses for accessing the non-volatile memory array 115. The row address buffer/decoder 220 selects the appropriate word line 129 based on the row address that has been input, and the column address buffer/decoder 210 selects the appropriate bit line 139 based on the column address that has been input. Here, reading data from, or writing data to, the non-volatile memory array 115 is done in page units. When writing, the data buffer 200 temporarily stores, in page units, the data that has been input from the exterior of the flash memory device 100, and writes this to the non-volatile memory cells in page units. Meanwhile, when reading, the data buffer 200 temporarily stores the data that has been read out, in page units, via the sense amp 190, and outputs the data to the exterior of the flash memory device 100.

FIG. 18 is a timing chart for reading out data from the flash memory device 100. The READ command for reading out data is input to the controller 300 along with the external signal CLE. Following this, when the addresses ADDR00-ADDR0n of the data to be read are input to the controller 300 along with the external signal ALE, the data from the non-volatile memory cells in the corresponding page 120 is stored in the data buffer 200 via the sense amp 190. The data that is stored in the data buffer 200 is read out when the external command NRE is changed after the R/B signal transitions from low to high.

When writing to the non-volatile memory array 115, in order to avoid defective blocks and blocks to which data has already been written, data must be written to blocks that have been erased. Thus, information for associating the data that has been written to the blocks with the logical addresses of that data, and information regarding defective blocks, is written to the second region 160. Furthermore, the data that is read out from the second region 160 is stored in the volatile memory cells of a RAM (Random Access Memory) or the like; thus the data is lost when the power supply is turned off. This requires that data be read out from the second region 160 each time initialization is performed when the power supply is turned on. Consequently, in the flash memory device 100, each time the power supply is turned on, there is a need to perform the initialization process, by reading out the data from the second region 160 so as to know the relationship between the aforementioned data and addresses and so as to know the locations of the defective blocks.

In the flash memory device 100, first the non-volatile memory array 115 is accessed in order to read out the data in the second region 160 in page units during the initialization process. FIG. 19 shows the data structure for the data that is read out to the data buffer 200 in page units. As is shown in FIG. 19, the data that is read out to the data buffer 200 comprises the data of the first region 150 and the second region 160. The memory control unit on the exterior of the flash memory device 100 generates and stores an address conversion table for defining, for example, associations between the data and the addresses in the data that has been read out, based on the data from the second region.

In the initialization process, the second region 160 of the first page 120 in each of the blocks 110, for example, is read out. The non-volatile memory capacity of the flash memory device 100 is 64 Mb, the page comprises a first region of 512 bytes and a second region of 16 bytes, one block comprises 32 pages and the time required to read one page is 25 µs (block size is 16 Kbytes and bock number is 512), so approximately 13 µs is required to read out the data in the second region 160. If the non-volatile memory capacity is larger, at 8 Gb, the page comprises a first region of 2048 bytes and a second region of 64 bytes, with one block comprising 64 pages (block size is 128 Kbytes and bock number is 8192). If the time required to read a single page is 25 µs, then it would take approximately 230 ms to read out the data in the second region 160.

The time required for the initialization process increases with the non-volatile memory capacity of the flash memory device 100, increasing the time before it is possible to read or write the data in the non-volatile memory array 115 correctly.

Thus, an object of the present invention is to provide a non-volatile memory device that can reduce the time required for the initialization process. This invention addresses this object as well as other objects, which will become apparent to those skilled in the art from this disclosure.

SUMMARY OF THE INVENTION

In order to solve the problem described above, a first aspect of the present invention is a non-volatile memory device comprising a non-volatile memory array that includes a plurality of pages. Each page has a plurality of non-volatile memory cells, a first region for storing data, and a second region for storing control data that is associated with the data of the first region. The non-volatile memory device further comprises a read out unit configured to read out data from the pages, and a data buffer for temporarily storing data that has been read out from the pages by the read out unit. When reading out the control data, the read out unit reads out the second region, across a plurality of pages, at one time.

The control data for the second region is read out at one time across a plurality of pages and is stored in a data buffer. This reduces the time required for reading control data. As a result, the time required for initialization is reduced, thus reducing the time required before it is possible to access the non-volatile memory device. Here, the control data includes the logical addresses associated with the data in the first region and error data. For example, the control data may include replacement data for replacing, with redundant cells, any defective non-volatile memory cells in the first region, defective block data indicating any blocks wherein defects have occurred, error correction codes for the data in the first region, and so forth. Thus, the control data is read out from the second region at the time of initialization, and an address conversion table for converting addresses based on the control data that has been read out is created.

A second aspect of the present invention is the non-volatile memory device recited in the first aspect, further comprising bit lines for connecting the read out unit with the non-volatile memory cells in the first and second regions. The non-volatile memory cells in the second regions spanning a plurality of pages are connected by mutually differing bit lines. Control data in the non-volatile memory cells in the second regions is read out using mutually differing bit lines. This allows control data to be read out across a plurality of pages at one time, while collision of control data is prevented.

A third aspect of the present invention is the non-volatile memory device recited in the first aspect, further comprising a memory control unit for creating an address conversion table for assigning a correspondence between a logical address, input from a system for controlling the non-volatile memory device, and a physical address of the non-volatile memory array, based on the control data in the second regions that were read out at one time by the read out unit across a plurality of pages.

By reading out the control data across a plurality of pages at one time, it is possible to read out the data for creating the address conversion table at one time. This allows the address conversion table to be produced quickly, reducing the time required for initialization, which is to say, reducing the time before it is possible to access the non-volatile memory device.

A fourth aspect of the present application is the non-volatile memory device recited in the third aspect, wherein the memory control unit converts a logical address, input in order to access the non-volatile memory device, into a physical address, based on the address conversion table.

A fifth aspect of the present invention is the non-volatile memory device recited in the first aspect, wherein the non-volatile memory device further comprises a plurality of second bit lines connected to the non-volatile memory cells in the second regions spanning a plurality of pages. The read out unit, when reading out the control data, reads out the control data from non-volatile memory cells in the second region, across a plurality of pages, via a plurality of corresponding second bit lines.

The reading out of the control data within the non-volatile memory cells in the second region is performed through reading out the control data via the second bit lines in each of the non-volatile memory cells. This enables the control data to be read out across a plurality of pages at one time, without collisions.

A sixth aspect of present is the non-volatile memory device recited in the fifth aspect, wherein the non-volatile memory cells in the first and second regions are disposed in the form of a matrix. The non-volatile memory device further comprises a plurality of first word lines, disposed in the row direction and connected in common to the non-volatile memory cells in the first region for each of the pages; a plurality of second word lines, disposed in the row direction, connected in common to the non-volatile memory cells in the second region for each of the pages; a plurality of first bit lines connected in common to the non-volatile memory cells disposed in the column direction in the first and second regions, and word line selection units that are configured to activate the first and second word lines for each page when the control data is not being read out (hereinafter "during normal operations"), and for activating the plurality of second word lines, across a plurality of pages, when the control data is being read out. Here, the read out unit comprises a bit line selection unit which is configured, during normal operations, to select a plurality of first bit lines and read out data via the plurality of first bit lines from the non-volatile memory cells of the first region and the second region of one page and, when reading out the control data, select the plurality of second bit lines and read out the control data via the plurality of second bit lines from the non-volatile memory cells in the second region, across a plurality of pages.

The non-volatile memory cells in the first and second region are each connected to the first bit lines, and the non-volatile memory cells in the second region are also connected to second bit lines. Note that the non-volatile memory cells in the second region are connected in common by the first bit lines. In other words, the non-volatile memory cells in the second region are disposed in one column or a plurality of columns in the lengthwise direction so as to share a common column address in the non-volatile memory array. Here, one page's worth of data is, in normal operations, read out from the first and second region of the page via the first bit line. Meanwhile, when the control data is read out, the second word lines of the second region across a plurality of pages are activated, and the second region across a plurality of pages are accessed via the second bit lines. This enables the control data that is stored in the second region to be read out efficiently.

A seventh aspect of the present invention is the non-volatile memory device recited in the first aspect, wherein the non-volatile memory cells in the first and second regions are disposed in the form of a matrix, the non-volatile memory device further comprising a plurality of first bit lines, connected in common to non-volatile memory cells that are disposed in the column direction of the first and second regions; and the non-volatile memory cells in the second regions spanning a plurality of pages are connected to mutually differing first bit lines.

The read out of the control data from the non-volatile memory cells in the second region is performed by reading out the control data via each of the first bit lines for the non-volatile memory cells. Here, the non-volatile memory cells in the second region are disposed to each be different in the column direction, enabling the read out of the control data across a plurality of pages simultaneously while preventing collisions.

An eighth aspect of the present invention is the non-volatile memory device recited in the seventh aspect, wherein the non-volatile memory device further comprises a plurality of first word lines, disposed in the row direction and connected in common to the non-volatile memory cells in the first region for each of the pages; a plurality of second word lines, disposed in the row direction and connected in common to the non-volatile memory cells in the second region for each of the pages; word line selection units configured to activate the first and second word lines for each page when the control data is not being read out (hereinafter "during normal operations"), and configured to activate the plurality of second word lines, across a plurality of pages, when the control data is being read out. Here, the read out unit comprises a bit line selection configured to, during normal operations, select a plurality of first bit lines and read out data from the non-volatile memory cells of the first region and the second region of one page via a plurality of corresponding first bit lines and, when reading out the control data, select the plurality of first bit lines and read out the control data via the plurality of first bit lines from the non-volatile memory cells in the second regions, across a plurality of pages.

The non-volatile memory cells in the first and second region are each connected by the first bit lines. Furthermore, the non-volatile memory cells in the second region are connected to mutually differing first bit lines. In other words, the non-volatile memory cells in the second region are disposed so as to have different column addresses in the non-volatile memory array. Here, the second word lines in the second region across a plurality of pages are activated when reading out the control data, and only the second regions, across a plurality of pages, are accessed via the first bit lines, which are different for each. This enables the efficient read out of the control data that is stored in the second regions.

A ninth aspect of the present invention is the non-volatile memory device recited in the fifth or seventh aspect, wherein the word line selection units comprise word line switching units configured to receive a signal from the first word line and a control signal for selecting word lines, generated by commands for reading out the control data, and output a signal for determining activity/inactivity of the second word lines.

For example, when each word line selection unit comprises an OR gate, when reading out the control data, if "H" is input based on a command for reading out the second region simultaneously across a plurality of pages, the second word line for a plurality of pages would be activated to go to "H," regardless of the inputs of the first word lines. Meanwhile, when a normal command is input and the input of the OR gate is "L," the activity/inactivity of the second word lines is determined in accordance with the inputs of the first word lines. Consequently, when reading out the control data, the second word lines for a plurality of pages are active, and the control data is read out efficiently from the non-volatile memory cells in the second region, across a plurality of pages, via the second bit lines.

Furthermore, the first word line is selected by decoding the input address. Because this word line signal is input, the word line switching unit can read out data from the page specified by the address.

A tenth aspect of the present invention is the non-volatile memory device recited in the fifth or seventh aspect, wherein the word line selection units comprise word line switching units configured to receive a control signal for selecting word lines that is generated by commands for reading out the control data, and a signal from the second word line, and to output a signal for determining the activity/inactivity of the first word lines. This tenth aspect has the same effect as the ninth aspect.

An eleventh aspect of the present invention is the non-volatile memory device recited in the sixth aspect, wherein the non-volatile memory device further comprises a bit line switching unit provided between the non-volatile memory cells in the second regions and the first and second bit lines. The bit line switching unit connects the non-volatile memory cells in the second regions to corresponding second bit lines when a command to read out the control data is input, and connects the non-volatile memory cells in the second regions to corresponding first bit lines when the command is not input.

The bit line switching unit disables the reading out of data from the first bit lines, and enables the reading out of data from the second bit lines, when a command is input. At this time, the inputting of the command causes the bit line selection units to activate the second word lines across a plurality of pages. Consequently, the bit line selection unit reads out control data across a plurality of pages via the second bit lines from the non-volatile memory cells in the second region. Meanwhile, during normal operations, the bit line switching unit enables the first bit lines connected in common to the non-volatile memory cells in a plurality of pages, and the word selection unit activates only the first and second word lines of the page to be accessed. This enables the read out of data from the non-volatile memory cells of the page to be accessed via the first bit lines. When reading out the control data in this way, the bit line switching unit switches the second bit lines to read out the control data, enabling the efficient read out of the control data across a plurality of pages at one time while preventing data collisions.

A twelfth aspect of the present invention is the non-volatile memory device recited in the eleventh aspect, wherein the bit line switching unit comprises a first switching element and a second switching element, the first switching element and the second switching element having mutually differing polarities.

A thirteenth aspect of the present invention is the non-volatile memory device recited in the sixth aspect, wherein the non-volatile memory array comprises a plurality of blocks which are data erase units and comprise a plurality of pages; the word line selection units activate a plurality of second word lines connected to the non-volatile memory cells in the second regions within a single block when reading out the control data; and the bit line selection unit reads out the control data via a plurality of second bit lines from the second regions within the block. This enables the read out of control data from the second regions of a plurality of blocks across a plurality of pages.

A fourteenth aspect of the present invention is the non-volatile memory device recited in the sixth aspect, wherein the non-volatile memory array comprises a plurality of blocks which are data erase units and comprise a plurality of pages; the word line selection units activate, in each block, any of the second word lines connected to the non-volatile memory cells in the second regions when reading out the control data; and the bit line selection unit reads out the control data via corresponding second bit lines, from any one of the second regions in each block. This enables the read out of control data from the second regions of a plurality of blocks across a plurality of pages.

A fifteenth aspect of the present invention is the non-volatile memory device recited in the first aspect, wherein a command is provided for reading out, at one time, the second regions, across a plurality of pages.

The external memory control unit of this memory device issues a command for reading out the control data from the second region across a plurality of pages of the non-volatile memory device, enabling the read out of the second region, across a plurality of pages, at one time.

A sixteenth aspect of the present invention is the non-volatile memory device recited in the fifteenth aspect, wherein the non-volatile memory array comprises a plurality of blocks which are data erase units and comprise a plurality of pages; and the command is a command for reading out, at one time, the second regions within a block, across a plurality of pages, or a command for reading out, at one time, the second regions within different blocks, across a plurality of pages.

When the command is a command to read out, at one time, the second regions within a block, across a plurality of pages, the second regions within the same block can be read out at one time. Furthermore, a command that is a command for reading out, at one time, second regions within different blocks across a plurality of pages enables the reading out, at one time, of the second regions in different blocks across a plurality of pages.

The non-volatile memory device according to the present invention reduces the time required for initialization, thus reducing the time before it is possible to access the non-volatile memory device.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

A non-volatile memory device according to the present invention comprises a non-volatile memory array, a read out unit, and a data buffer. The non-volatile memory array comprises a plurality of blocks which are data erase units. These blocks comprise a plurality of pages, which are the units for reading and writing data. Furthermore, each page comprises a first region for storing the data that is read out to the exterior of the non-volatile memory device or that is written from the exterior, and a second region for storing control data associated with the data in the first region. During the initialization process, such as when powering up, the read out unit simultaneously accesses the second regions across a plurality of pages to read out the control data from the second regions. The control data that is read out is stored temporarily in a data buffer. Thereafter, the memory control unit, which is external to the non-volatile memory device, creates an address conversion table based on the control data.

In this manner, the control data in the second regions is read out across a plurality of pages at one time, thus allowing the control data to be read out rapidly. This makes it possible to rapidly perform initialization processes, such as the creation of the address conversion table, reducing the time before it is possible to access the non-volatile memory device.

Embodiment 1

Constitution

Figure 1:
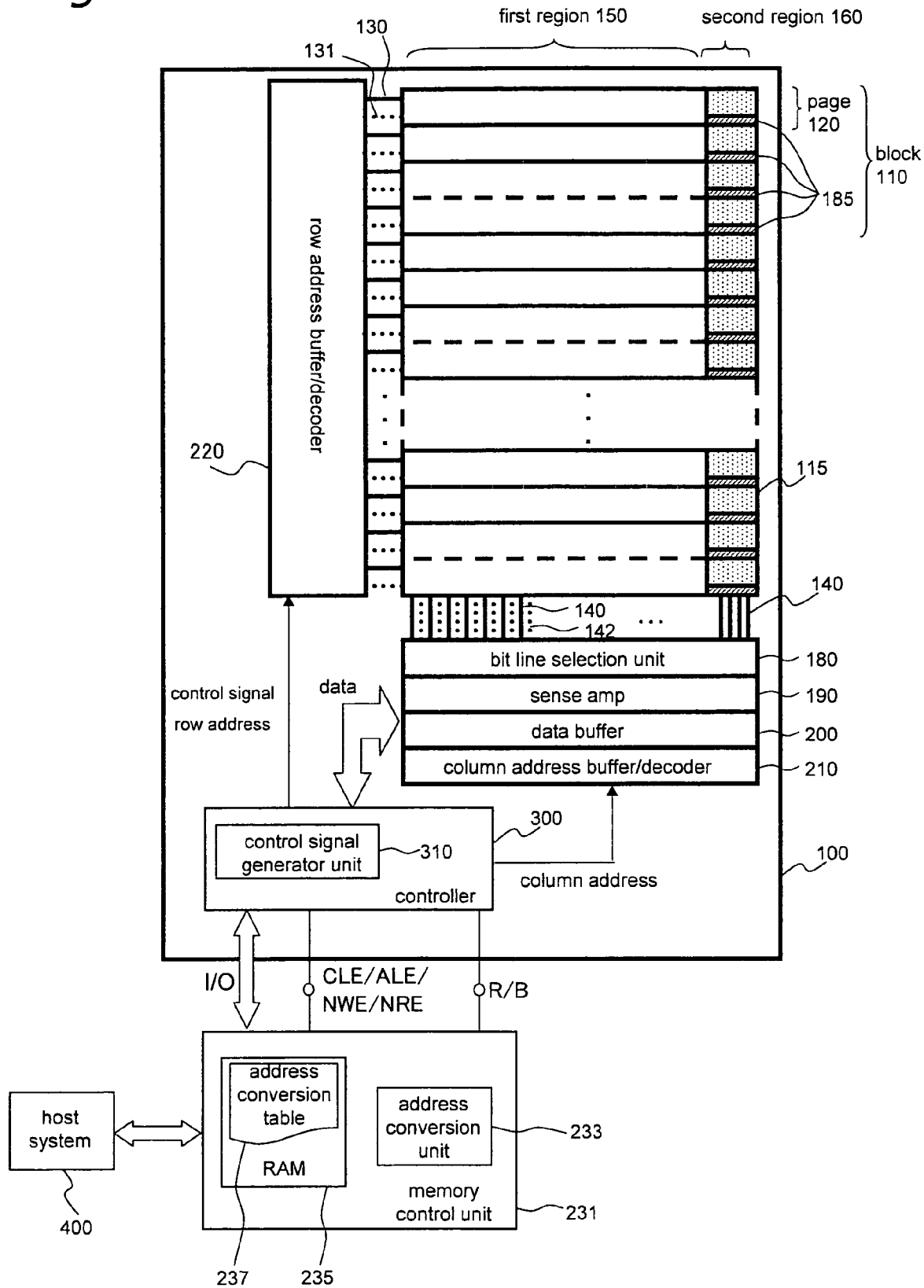
FIG. 1 is a block diagram of a non-volatile memory device according to a first embodiment.
Figure 2:
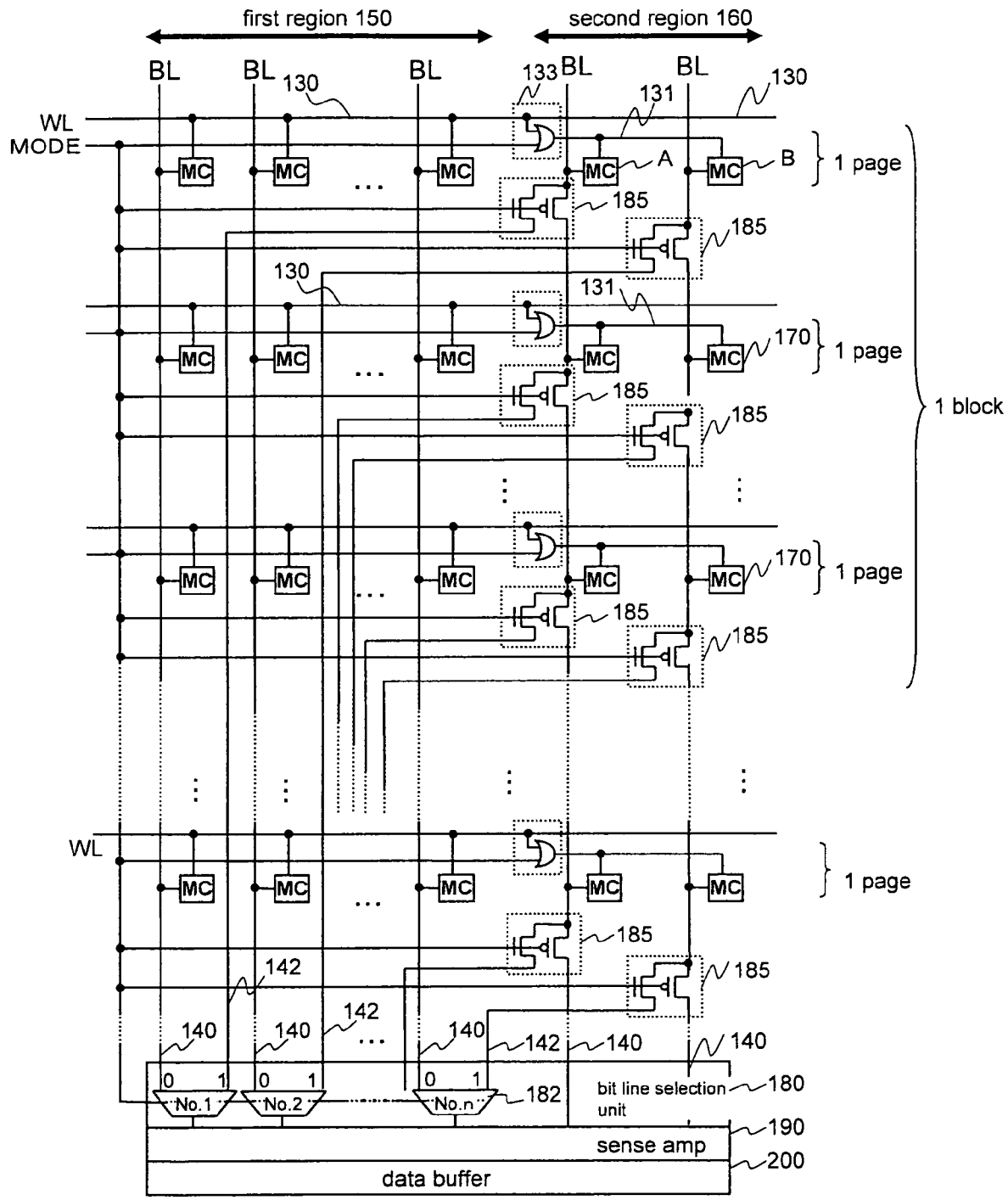
FIG. 2 is a block diagram of a non-volatile memory array and a bit line selection unit in the non-volatile memory device of FIG. 1.

FIG. 1 is a block diagram of a non-volatile memory device according to a first embodiment, and FIG. 2 is a block diagram of a non-volatile memory array and a bit line selection unit housed in the non-volatile memory device of FIG. 1.

The non-volatile memory device 100 comprises a non-volatile memory array 115, a bit line selection unit 180, a sense amp 190, a data buffer 200, a column address buffer/decoder 210, a row address buffer/decoder 220, and a controller 300 that includes a control signal generator unit 310. The non-volatile memory device 100 is connected to a memory control unit 231 comprising an address conversion unit 233, a RAM 235, and an address conversion table 237. The structures of each of the components are described below.

(1) Non-Volatile Memory Device (1-1) Non-Volatile Memory Array

The non-volatile memory array 115 comprises a plurality of blocks 110, which are data erase units. The blocks 110 include a plurality of pages 120, which are the units for reading and writing the data. Each page 120 comprises a first region 150 and a second region 160.

The non-volatile memory cells 170 in the non-volatile memory array 115 are disposed in the form of a matrix so as to be positioned at the intersections of a plurality of word lines and a plurality of bit lines, as shown in FIG. 2. The word lines include first word lines 130 for selecting the first region 150 of one page from the first region 150 of a plurality of pages, and second word lines 131 for selecting the second region 160 of one page from the second region 160 of a plurality of pages. The bit lines include first bit lines 140 and second bit lines 142. During normal operations, the first bit lines 140 are used when reading out data from the first region 150 and second region 160, via the bit line selection unit 180, to the sense amp 190, or when writing data via the bit line selection unit 180 to the non-volatile memory cells of the first region 150 and second region 160. During the initialization processes, which is to say, when the control data is read out, the second bit lines 142 are used in reading out control data from the non-volatile memory cells 170 of the second region 160. Note that "normal operations" refers to operating modes other than those in which control data is read out.

The non-volatile memory cells 170 of the first region 150 are connected to the first word lines 130 and the first bit lines 140. Here, the non-volatile memory cells 170 in the first region 150 of a given page share a first word line 130, and are each connected to different first bit lines 140. Note that each of the first bit lines 140 in the first region is shared by the non-volatile memory cells that have the same column address, across a plurality of pages.

Meanwhile, the non-volatile memory cells 170 in the second region 160 are connected to the second word lines 131, the first bit lines 140, and the second bit lines 142. Here, the non-volatile memory cells 170 in the second region 160 of a given page share a second word line 131, and are each connected to different first bit lines 140 and different second bit lines 142. Note that each of the first bit lines 140 in the second region 160 is shared by the non-volatile memory cells 170 in the second region that share a column address, across a plurality of pages. In other words, the second regions 160 are disposed in the same positions in the column direction. Meanwhile, the second bit lines 142 of the second regions 160 are each connected to the non-volatile memory cells in the second regions 160. Furthermore, the first bit lines 140 and the second bit lines 142 are each connected to the bit line selection unit 180.

(1-2) Control Data

The first region 150 stores data that is to be read out to the exterior of the non-volatile memory device 100 and data written from the exterior. Meanwhile, control data, including, for example, the logical addresses associated with the data in the first region, error data, and the like, is stored in the second region 160. Examples of control data include replacement data for replacing, with redundant cells, defective non-volatile memory cells that occur in the first region, defective block data that indicates the blocks wherein errors have occurred, error correction codes for the data in the first region, voltage levels for reading, writing and erasing, and other types of control data. Furthermore, when a command for reading out data from the second region is input, the control data is read out from the second region 160. The memory control unit 231, described below, generates an address conversion table for converting addresses based on the control data.

Citing a specific example, when writing to the non-volatile memory array 115, there is the need to write the data to blocks that have been erased, in order to avoid defective blocks and blocks to which data have already been written. In such a case, the memory control unit 231, described below, generates an address conversion table based on the control data in order to associate the data that has been written with the logical addresses of the data. Address conversion is performed based on the address conversion table when reading or writing data.

This control data is written to the second region 160 by the memory control unit 231, which is external to the non-volatile memory device 100, when writing data to the first region 150 based on the addresses and replacement data for defective cells that occurred in testing prior to shipping or when the non-volatile memory device 100 is used.

(1-3) Controller and Control Signal Generator Unit

The controller 300 has a control signal generator unit 310, and receives data, addresses, various commands, external signals, and the like, from the memory control unit 231, which is external to the non-volatile memory device 100. The various commands include, for example, a READ command for reading, a WRITE command for writing, an S-CMD command for reading control data, and the like. Furthermore, external signals include external signals CLE, ALE, NWE, NRE, and the like. Here, the external signal CLE indicates that the data applied to the I/O terminal is a command, the external signal ALE indicates that the data applied to the I/O terminals is an address, the external signal NWE is a write strobe for the data applied to the I/O terminals, and the external signal NRE is a read strobe for the data output from the I/O terminal. Furthermore, the controller 300 outputs, from the R/B pin, a signal indicating whether or not access to the non-volatile memory device 100 is possible.

The controller 300 further interprets the READ command, the WRITE command or the external signal to generate the internal signals for performing the normal read and write operations. Meanwhile, the control signal generator unit 310 interprets the external signals and the S-CMD command for reading out the control data to generate the control signals for controlling reading of the control data of the second region 160. The control signal generator unit 310 may interpret the READ command and the external signals to generate control signals for controlling the reading of the control data of the second region 160, and may interpret the external signals, the READ command, and the S-CMD command for reading out the control data to generate control signals. The control signals include, for example, signals for controlling the selection of the word lines and bit lines, and the MODE signal, described below, is generated based on these control signals.

Furthermore, the controller 300 receives row addresses and column addresses which have been converted by the memory control unit 231 from logical addresses, which were input from the host system 400 side, into physical addresses for the non-volatile memory array 115. The memory control unit 231, described below, has an address conversion table that is generated based on the control data of the second region, and performs address conversion based on the address conversion table.

The controller 300 outputs the internal signals that have been generated, and the row address and column address that are physical addresses, to the row address buffer/decoder 220 and to the column address buffer/decoder 210. Furthermore, the control signal generator unit 310 outputs the control signals that have been generated to the row address buffer/decoder 220 and to the column address buffer/decoder 210.

(1-4) Word Line Switching Unit

The word line switching units 133 are configured to control whether or not the second word lines 131 are active, and are provided so as to correspond to each page. Furthermore, MODE signal and the signal from the first word line 130 are input to the word line switching unit 133 as shown in FIG. 2. The MODE signal that is input to the word line switching units 133 is generated based on the S-CMD command for reading out the control data, and is input to the word line switching unit 133. Here, control data is read by inputting, for example, a command that combines the S-CMD command for reading the second region 160, a READ command, and an address, or through inputting a command that is a combination of the S-CMD command and an address, or the like. These commands are input to the controller 300 from the memory control unit 231 that is external to the non-volatile memory device 100.

In the first embodiment described below, the S-CMD for reading the second region 160 is input to the control signal generator unit 310 within the controller 300 from the exterior of the non-volatile memory device 100. At this time, the control signal generator unit 310 generates the control signal for controlling the reading of the second region 160 based on the S-CMD. The row address buffer/decoder 220 generates the MODE signal based on the control signal and inputs the MODE signal into the word line switching units 133. Furthermore, the word line switching units 133 output a signal that defines the activity/inactivity of the second word lines 131 according to the input of the MODE signal and the signals from the first word lines 130.

For example, the word line selection units 133 comprises OR gates, as shown in FIG. 2. When the S-CMD is input to the control signal generator unit 310, an "H" MODE signal is input to the OR gates. When the "H" MODE signal is input, the output of the OR gates goes to "H" regardless of the state of the first word line 130 inputs, activating the second word lines 131. Note that in FIG. 2, the MODE signal is input simultaneously to the plurality of word line switching units 133. As a result, the second word lines 131 of the second region 160 for a plurality of pages are activated simultaneously.

Meanwhile, when a normal command is input so that an "L" MODE signal is input to the OR gates, the activity/inactivity states of the second word lines 131 are determined according to the inputs of the first word lines 130. In other words, if a first word line 130 is active, then the second word line 131 will also be active, and if a first word line 130 is inactive, then the second word line 131 will also be inactive. Note that it suffices that the word line selection units 133 need only control the active/inactive states of the first word lines 130 and the second word lines 131 according to the MODE signal, and these are not limited to OR gates.

(1-5) Bit Line Switching Units

The bit line switching units 185 are provided between the non-volatile memory cells 170 of the second region 160 and the first bit lines 140 and second bit lines 142, and perform switching so as to connect either the first bit lines 140 or the second bit lines 142 to the non-volatile memory cells 170. Each of the first bit lines 140 of the second region 160 are shared by a plurality of non-volatile memory cells 170 of the second region 160 that share common column addresses. When reading the control data of the second region 160 across a plurality of pages, the bit line switching units 185 switch to the second bit lines 142 so as to read out the control data, enabling the prevention of data collisions.

Specifically, the bit line switching units 185 comprise, for example, a PMOS transistor and an NMOS transistor, as shown in FIG. 2. The PMOS transistor is provided between the first bit line 140 and the non-volatile memory cell 170 of a second region 160, and the NMOS transistor is provided between the second bit line 142 and the non-volatile memory cell 170 of a second region 160. Furthermore, the MODE signal input is applied to the gates of the PMOS transistor and the NMOS transistor. Here, the MODE signal is the signal that is generated by the control signal generator unit 310 and the row address buffer/decoder 220 based on the S-CMD for reading out the second region 160, as described above.

When the control data is read out and the S-CMD is input to the control signal generator unit 310 so that the "H" MODE signal is input to each of the transistor gates, the NMOS transistor turns ON and the PMOS transistor turns OFF, connecting the non-volatile memory cell 170 of the second region 160 to the second bit line 142. Meanwhile, when a normal command is input so that an "L" is input as the MODE signal, the NMOS transistor turns OFF and the PMOS transistor turns ON, connecting the non-volatile memory cell 170 of the second region 160 to the first bit line 140. In other words, the bit line switching units 185 disable the read out of the data from the first bit line 140 when an "H" MODE signal is input, and enable the read out of the data from the second bit line 142. At this time, the "H" MODE signal is input to the word line switching units 133, activating the second word lines 131 across a plurality of pages. As a result, the bit line selection unit 180, described below, is able to read out control data across a plurality of pages via the second bit lines 142 from the non-volatile memory cells 170 of the second region 160.

Meanwhile, during normal operations the MODE signal is "L," so the bit line switching units 185 enable the first bit lines 140, which are connected in common to the non-volatile memory cells 170 in a plurality of pages. At this time, only the first word lines 130 and second word lines 131 of the page to be accessed are activated by the row address buffer/decoder 220, as described below. As a result, one page's worth of data is read out from the non-volatile memory cells 170 in the page being accessed, via the first bit lines 140.

Note that the bit line switching units 185 need only be structured so as to allow switching between the first bit lines 140 and the second bit lines 142 for reading out the second region across a plurality of pages, and this is not limited to the PMOS and NMOS transistor structure described above.

(1-6) Row Address Buffer/Decoder

The row address buffer/decoder 220 decodes the row addresses input via the controller 300 to select the first word lines 130 and second word line 131 corresponding to the input address. The row address buffer/decoder 220 receives the internal signal for controlling the normal reading or writing, generated by the controller 300, to control reading or writing. The row address buffer/decoder 220 also receives the control signals generated by the control signal generator unit 310 based on the S-CMD command to generate the MODE signal. Furthermore, the row address buffer/decoder 220 inputs the generated MODE signal into the word line switching units 133, the bit line switch units 185 and the selector 182, as described below.

Here, the MODE signal, described above, is a control signal for the word line selection for controlling the selection of the word lines, and a control signal for bit line selection for controlling the selection of the bit lines, according to the S-CMD command for reading out the second region 160, and is also a control signal for selecting the bit lines for reading out the data to the sense amp 190 by controlling the selector 182, described below, according to a command. Furthermore, as described above, the read out of the second region 160 is controlled by changing the level of the MODE signal during normal operations and when reading out the second region.

Note that the row address buffer/decoder 220 may comprise the aforementioned word line switching units 133. In other words, although the word line switching units 133 in FIG. 2 are provided within the non-volatile memory array 115 and are structured separately from the row address buffer/decoder 220, the word line switching units 133 may be structured so as to be integrated with the row address buffer/decoder 220 which is external to the non-volatile memory array 115. This is preferred because it makes it possible to reduce the area of the non-volatile memory array 115 by the size of the word line switching units 133.

(1-7) Column Address Buffer/Decoder

The column address buffer/decoder 210 decodes the column address that is input via the control signal generator unit 310. In other words, the column address buffer/decoder 210 specifies the column address of one page's worth of data read out from the non-volatile memory cells 170 to the data buffer 200 via the sense amp 190.

(1-8) Bit Line Selection Unit

The bit line selection unit 180 reads out data from the non-volatile memory cells 170 via the bit lines, or writes data to the non-volatile memory cells 170 via the bit lines, based on the address that is decoded by the column address buffer/decoder 210, and is connected to the first bit lines 140 and the second bit lines 142.

The bit line selection unit 180 has a plurality of selectors 182, and the first bit lines 140 and the second bit lines 142 are connected to the selectors 182. Furthermore, the MODE signal is input to the selectors 182.

The connections between the bit line selection unit 180 and the first bit lines 140 and second bit lines 142 are, for example, as follows. The first selector 182 in FIG. 2 (the No. 1 selector 182 in FIG. 2) is connected to the No. 1 first bit line 140, and further connected to the second bit line 142 that is connected to the non-volatile memory cell 170 of the second region 160 that is located at the No. 1 page of the No. 1 block (the non-volatile memory cell A in FIG. 2). Similarly, the second selector 182 (the No. 2 selector in FIG. 2) is connected to the No. 2 first bit line 140, and further connected to the second bit line 142 that is connected to the non-volatile memory cell 170 of the second region 160 that is located at the No. 1 page of the No. 1 block (the non-volatile memory cell B in FIG. 2). Additionally, the third selector 182 (not shown) is connected to the No. 3 first bit line 140, and further connected to the second bit line 142 that is connected to the non-volatile memory cell 170 of the second region 160 that is located at the No. 2 page of the No. I block. The other selectors 182 are also similarly connected in this way to form pairs between the first bit lines 140 and the second bit lines 142.

The selectors 182 select either the first bit lines 140 or the second bit lines 142 depending on the MODE signal. Specifically, when reading the control data, the selectors 182 receive the "H" MODE signal, based on the S-CMD, to select the second bit lines 142. The control data that has been read is output to the data buffer 200 via the sense amp 190, described below. Meanwhile, during normal operations, the selectors 182 select the first bit lines 140.

Figure 3:
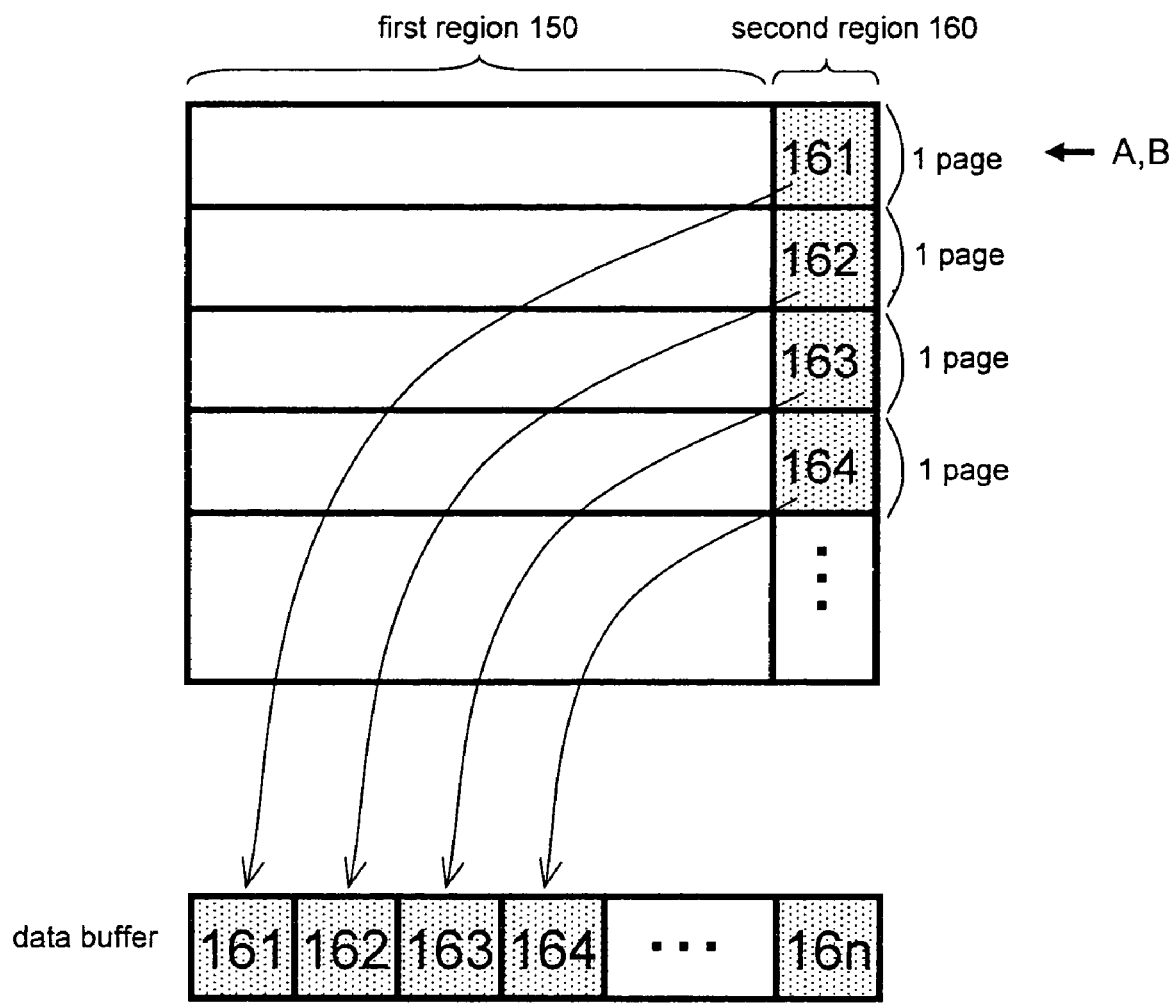
FIG. 3 is a schematic view showing storage in the data buffer 200.

FIG. 3 is a schematic view showing the state wherein the control data that is accumulated in the second region 160 is stored in the data buffer 200. In the second region 160, the second region of pages No. 1, No. 2, No. 3, No. 4, and so on are defined as the second region 161, 162, 163, 164, . . . 16n, respectively. At this time, the control data of the second region 161, 162, 163, 164, . . . 16n is read out to the data buffer 200 at one time by accessing the second region when reading out the control data. Furthermore, the No. 1 second region 161 in FIG. 3 includes the non-volatile memories A and B that are positioned in the second region of the No. 1 page in FIG. 2. Given the structure described above, the control data that is stored in the second region 161, 162, 163, 164, . . . 16n, across a plurality of pages in this way, is read out at one time to the data buffer 200. When buffer capacity of the data buffer 200 corresponds to one page, one page's worth of control data is read out.

Figure 16:
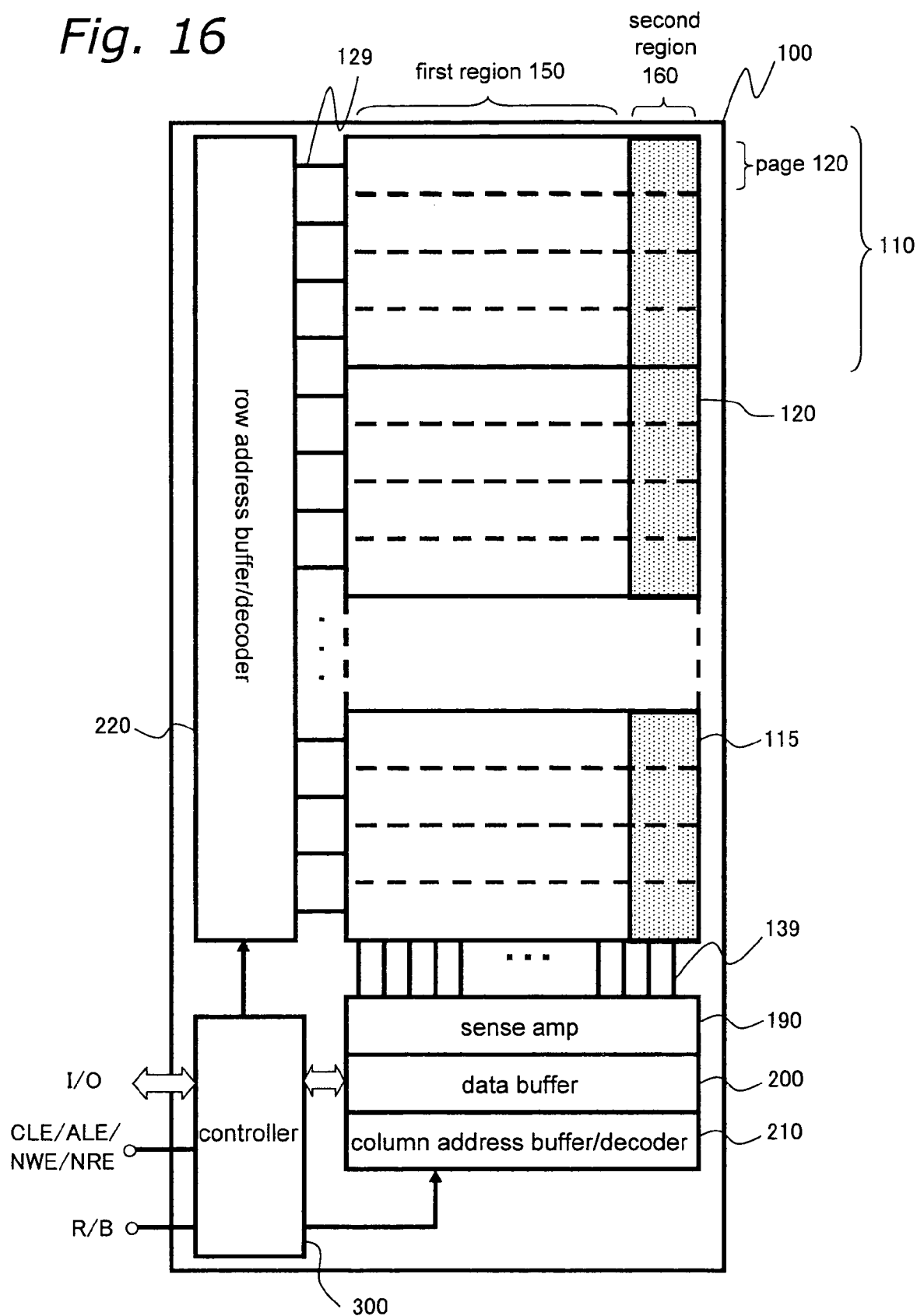
FIG. 16 is a block diagram of a conventional non-volatile memory device.
Figure 17:
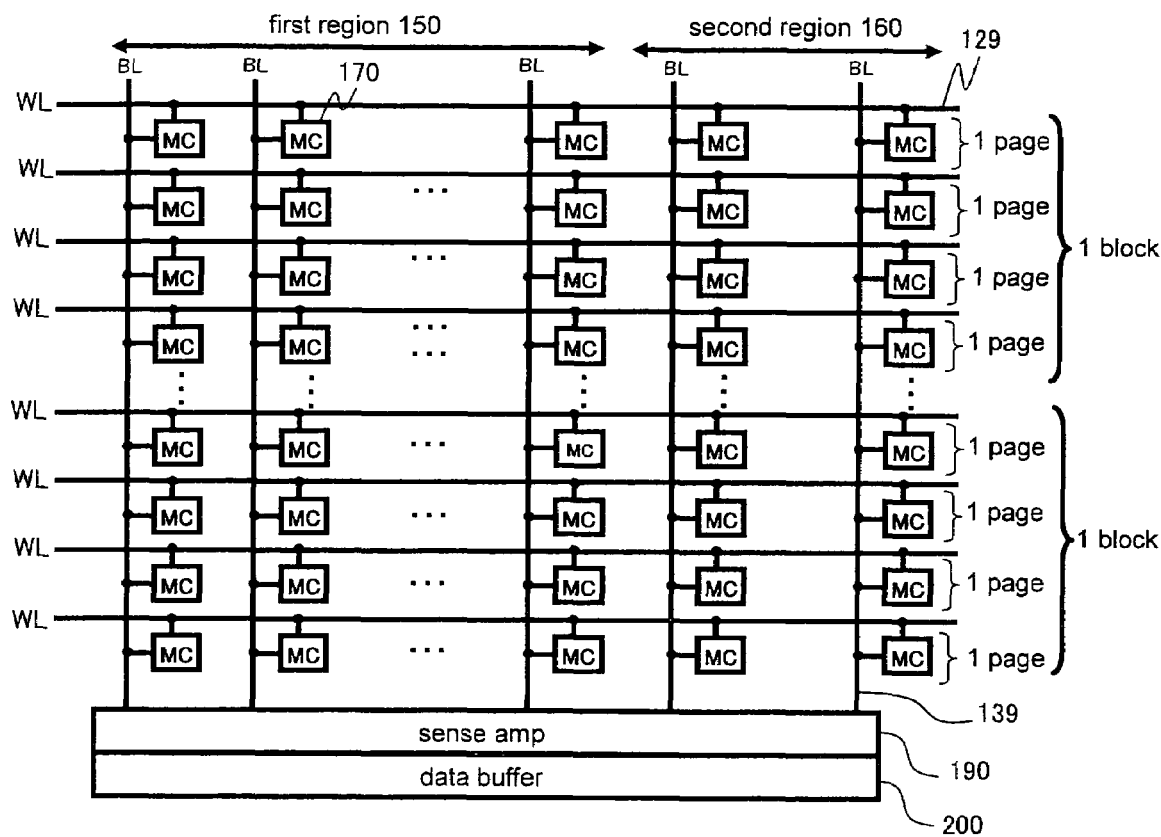
FIG. 17 is an explanatory view showing the connections of the memory cell array of a conventional non-volatile memory device.
Figure 18:
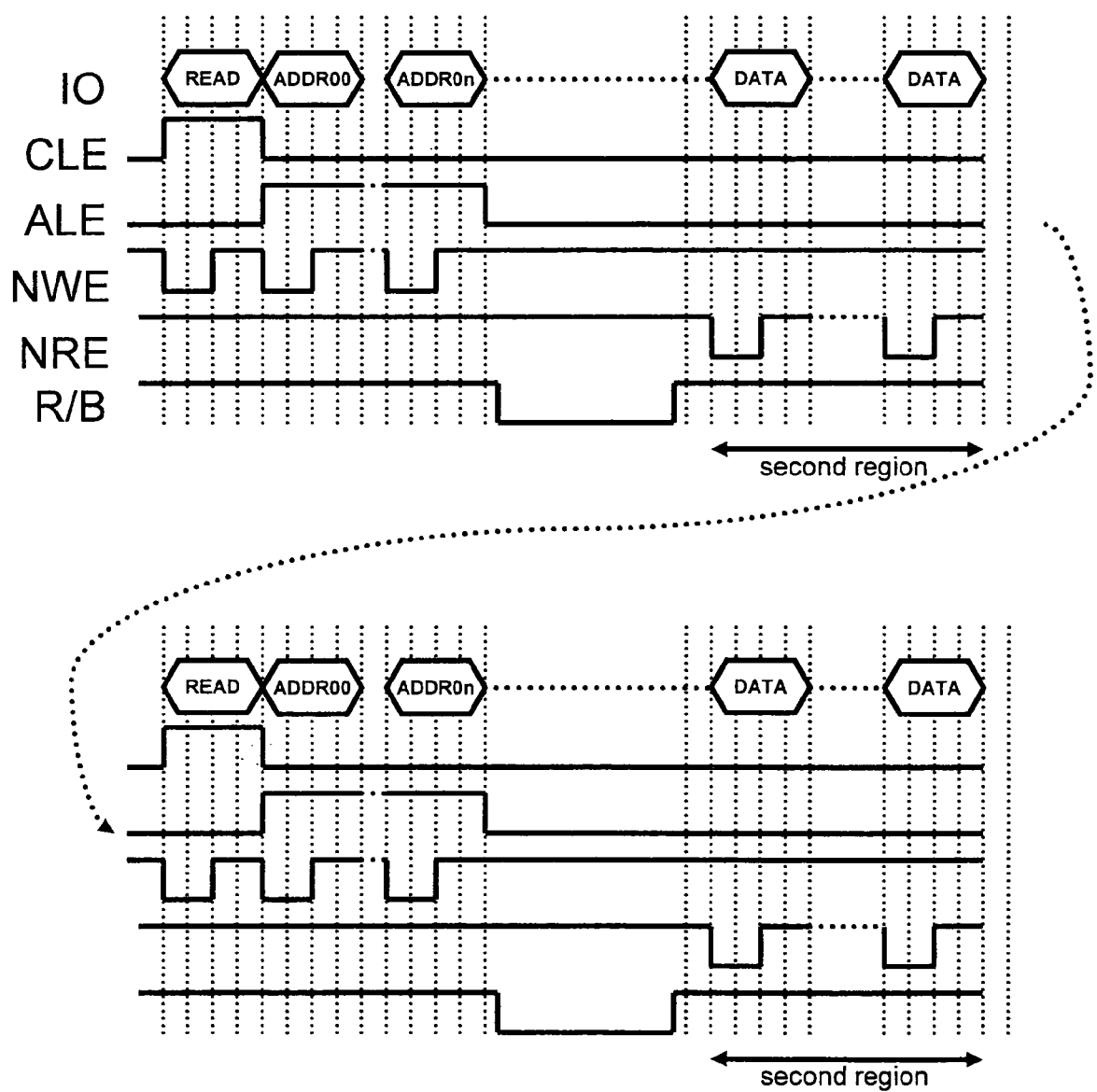
FIG. 18 is a timing chart showing the second region read out operation in a conventional non-volatile memory device.
Figure 19:
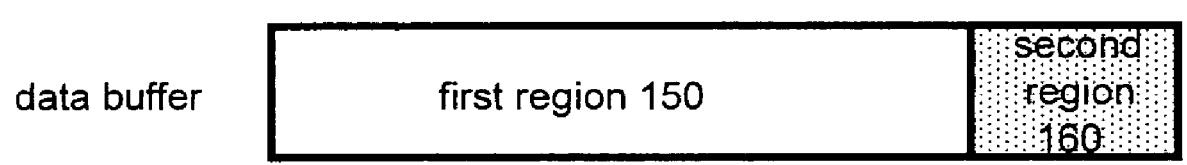
FIG. 19 is a data structure diagram of the data buffer during read out in a conventional non-volatile memory device.

Meanwhile, when a normal command is input, the selectors 182 select the first bit lines 140. Here, the structure of the data that is read out to the data buffer 200 is the same as the structure shown in FIG. 16, described above, and one page's worth of data, including the first region 150 and the second region 160, is read out to the data buffer 200.

(1-9) Sense Amp

The sense amp 190 amplifies the data that is read out in page units from the non-volatile memory cells 170 via the bit line selection unit 180. The sense amp 190 outputs the data that has been amplified to the data buffer 200.

(1-10) Data Buffer

The data buffer 200 receives and temporarily stores data that has been read out in page units via the sense amp, and then outputs the data to the memory control unit 231 that is external to the non-volatile memory device 100.

(2) Memory Control Unit

The memory control unit 231 is connected between the host system 400 and the non-volatile memory device 100, and issues commands to the non-volatile memory device 100 and transfers data, addresses, commands, and so forth between the host system 400 and the non-volatile memory device 100.

The memory control unit 231 includes an address conversion unit 233 and a RAM 235. During the initialization process, such as at power up, the memory control unit 231 reads out the control data from the second region and creates an address conversion table, based on the control data that has been read out, for handling access from the host system 400. Specifically, the RAM 235 of the memory control unit 231 stores the address conversion data based on the control data that is read out from the second region 160 when reading the control data. The memory control unit 231 generates the address conversion table for establishing the associations between the logical addresses input from the host system 400 and the physical addresses of the non-volatile memory array 115, based on the control data. The address conversion table is stored in the RAM 235.

The address conversion unit 233 converts into physical addresses the logical addresses of the row addresses and column addresses received by the memory control unit 231, based on the address conversion table 237 stored in the RAM 235, and outputs these physical addresses to the controller 300.

Flow of Control Data Read Out

Figure 4:
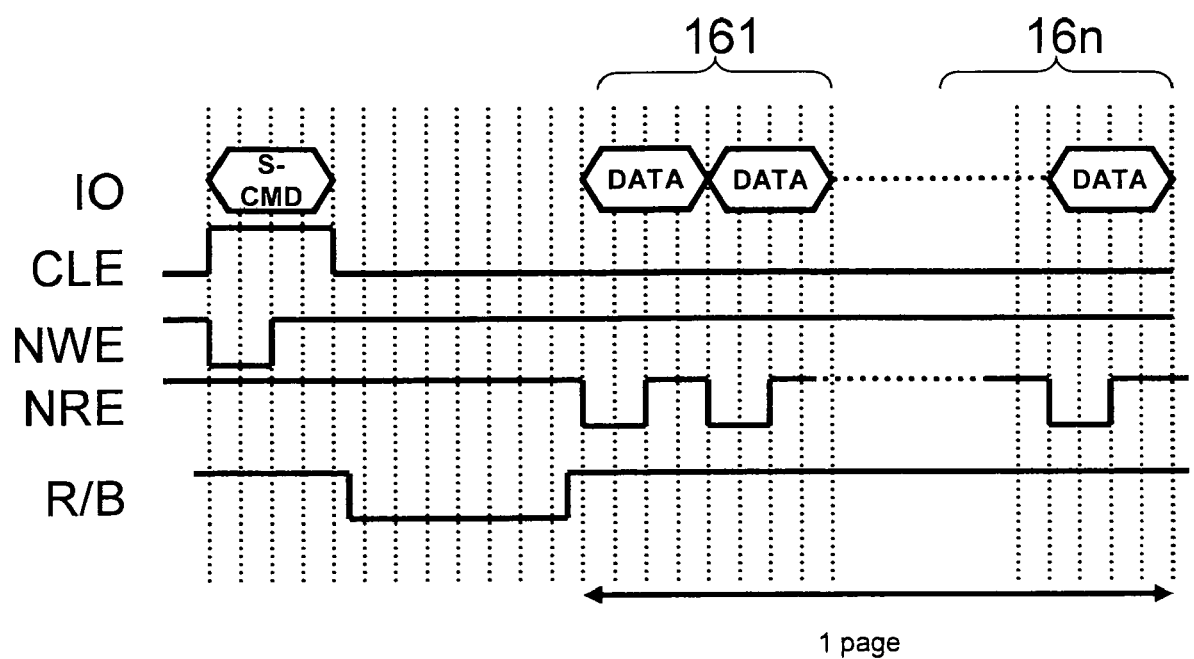
FIG. 4 is an example of a timing chart for a case wherein control data is read from the non-volatile memory device 100 according to the first embodiment.

Next, the flow of the process for reading out the control data of the non-volatile memory array 115 in the first embodiment will be described. FIG. 4 shows an example of a timing chart illustrating read out of the control data from a non-volatile memory device 100 according to the first embodiment by inputting the start command S-CMD.

When reading out the control data, the memory control unit 231 inputs into the control signal generator unit 310 the start command S-CMD, which starts the read out of the control data, along with the external signal CLE, based on the command input from the host system 400. When there is a change of state in the external signal NRE after the R/B signal has transitioned from low to high, the control data is read out from the second region 160 of the non-volatile memory array 115. In FIG. 2, the second region 160 of one page has two non-volatile memory cells 170, where two sets of data are read out from the No. 1 second region 161, as shown in FIG. 4.

Specifically, the memory control unit 231 inputs the S-CMD into the control signal generator unit 310. The control signal generator unit 310 and the row address buffer/decoder 220 generate the MODE signal based on the S-CMD, which is input to the word line switching units 133, the bit line switching units 185, and the selector 182 of the bit line selection unit 180. The "H" MODE signal is generated when the S-CMD is input. The word line switching units 133 are provided for each of the pages, and activate the second word lines 131 for a plurality of pages corresponding to the second region 160 after inputting the "H" MODE signal. When the "H" MODE signal is input, the bit line switching units 185 cut off the connection between the first bit line 140 and the non-volatile memory cell 170 in the second region 160, and connects the second bit line 142 to the non-volatile memory cell 170 in the second region 160. The selector 182 in the bit line selection unit 180 receives the "H" MODE signal and enables read out of the data from the second bit lines 142. Furthermore, the control data is read out from the second bit lines 142 via the sense amp 190 and then output to the exterior of the non-volatile memory device 100 after being stored temporarily in the data buffer 200.

Consequently, the second word lines 131 are activated across a plurality of pages, and control data is stored temporarily in the data buffer 200 via the second bit lines 142 that correspond to the respective second region 160 across a plurality of pages. The time for reading out the control data can thus be reduced because the control data is output at one time across a plurality of pages. Here, the memory control unit 231 generates the address conversion table based on the control data that is read out. As a result, when the control data is output at one time for a plurality of pages, the data for generating the address conversion table is read out at one time. This reduces the time before it is possible to access the non-volatile memory device, because it is possible to generate, for example, the address conversion table in a short time.

Note that the capacity of the data buffer 200 is normally one or several pages' worth of capacity, and thus it is not possible to read out the control data for all pages at the same time. It is possible, for example, to use the block address, or the like, to select only a specific region to read out the control data without exceeding the capacity of the data buffer.

Second Embodiment

Constitution

Figure 5:
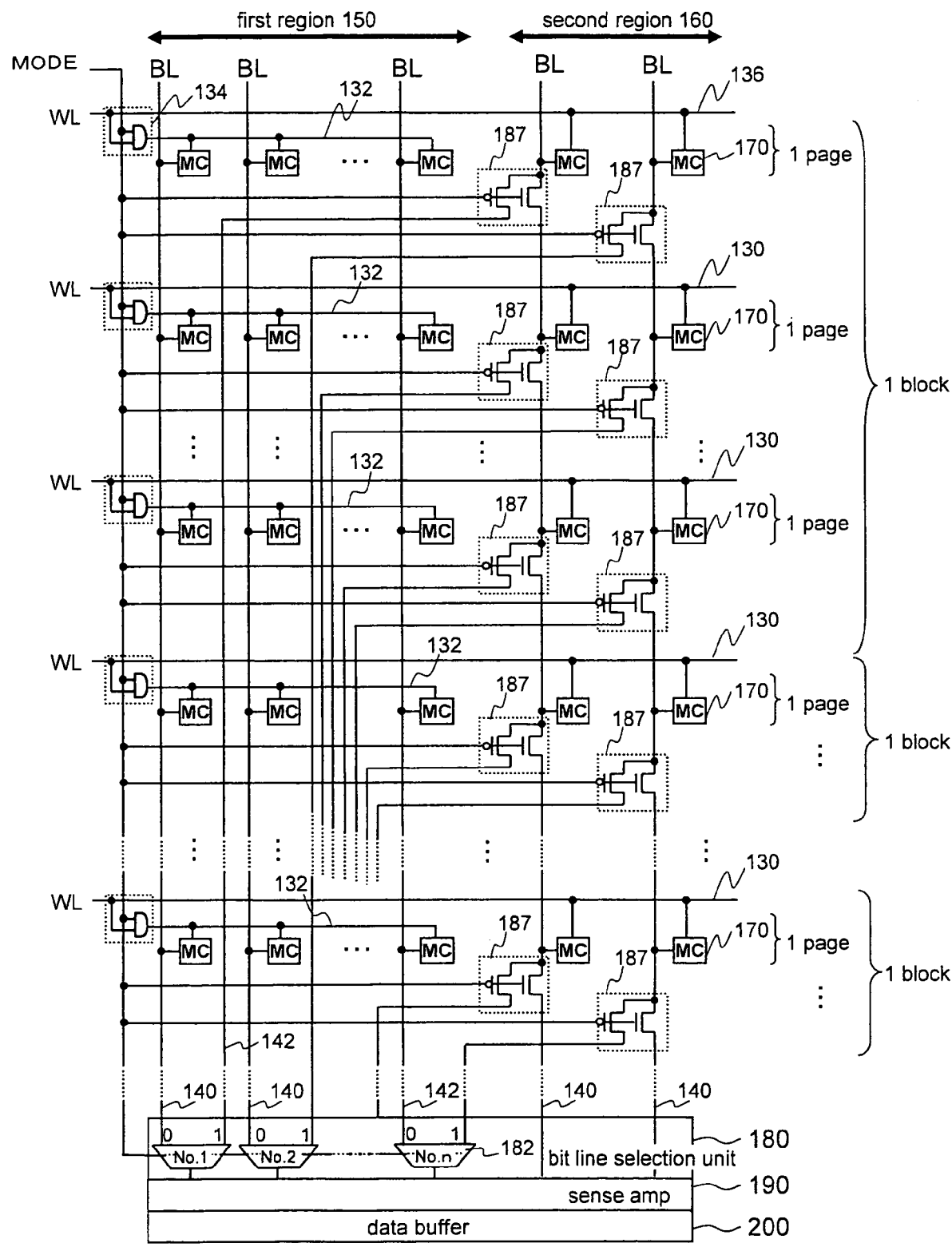
FIG. 5 is a block diagram of another non-volatile memory array housed in the non-volatile memory device according to the first embodiment in FIG. 1.

FIG. 5 is a block diagram of another non-volatile memory array housed in a non-volatile memory device according to the first embodiment in FIG. 1. The structures of the non-volatile memory array, the word line switching units 134, and the bit line switching units 187, described below, are different from those in the first embodiment, but all of the other structures are the same as in FIG. 1 for the first embodiment, and thus descriptions thereof are omitted.

(1) Non-Volatile Memory Array

Word lines include first word lines 132 for selecting a first region 150 of one of the pages from the first region 150 of all of the pages, and a second word line 136 for selecting a second region 160 for one of the pages from the second region 160 of all of the pages. Here, the non-volatile memory cells 170 of the first region 150 are connected to the first word lines 132 and the first bit lines 150. Meanwhile, the non-volatile memory cells 170 of the second region 160 are connected to the second word lines 136, the first bit lines 140, and the second bit lines 142.

(2) Word Line Switching Units

The word line switching units 134 are configured to switch so as to activate either the first word lines 132 or the second word lines 136, and are provided so as to correspond to each page. Furthermore, the word line switching units 134 differ from the word line switching units in the first embodiment and comprise, for example, AND gates, as shown in FIG. 5.

In a second embodiment, the S-CMD is input to the control signal generator unit 310 in order to read out the second region 160 when reading out the control data, in the same manner as in the first embodiment. Furthermore, the row address buffer/decoder 220 receives the control signals generated by the control signal generator unit 310 based on the S-CMD command to input and "L" MODE signal into the word line switching units 134 of the AND gate. The row address buffer/decoder 220 generates a signal for selecting the second word lines 136 for a plurality of pages based on the control signals. The second word lines 136, across a plurality of pages, are activated based on these signals that are generated. Conversely, the S-CMD may include an address for selecting specific second word lines 136 so as to activate the second word lines 136, across a plurality of pages, based on the address. The signals on the second word lines 136 are input to the word line switching units 134 of the AND gates.

When an "L" MODE signal is input to the AND gates, the outputs of the AND gates go to "L," deactivating the corresponding first word lines 132. It is also possible to activate the second word lines 136 of the second region 160 across a plurality of pages at the same time, as described above.

Meanwhile, when a normal command is input, the active/inactive states of the first word lines 132 and second word lines 136 are determined according to the input address. Specifically, if the second word lines 136 are activated according to the input address, the first word lines 132 also become active, and if the second word lines 136 are inactive, the first word lines 132 also be inactive. In other words, in normal operations, the results of the row address buffer/decoder 220 decoding the input addresses activate only the corresponding first word lines 132 and second word lines 136.

Note that the word line selection units 134 need only control the active/inactive states of the first word lines 132 and the second word lines 136 according to the S-CMD, and are not limited to AND gates.

(3) Bit Line Switching Units

The bit line switching units 187 comprise, for example, a PMOS transistor and an NMOS transistor, as shown in FIG. 5. The NMOS transistors are provided between the non-volatile memory cells 170 of the second region 160 and the first bit lines 140, and the PMOS transistors are provided between the non-volatile memory cells 170 of the second region 160 and the second bit lines 142.

Here, an "L" MODE signal is generated based on the S-CMD in order to read out the second region 160 when reading the control data. Furthermore, when the gates of the NMOS transistors and PMOS transistors receive an "L" MODE signal input, the PMOS transistors turn ON, and the NMOS transistors turn OFF, connecting the second bit lines 142 to the non-volatile memory cells 170 of the second region 160. At this time, a plurality of second word lines 136 across a plurality of pages are activated in accordance with the S-CMD. As a result, the bit line selection unit 180 is able to read out the control data, across a plurality of pages, via the second bit lines 142 from the non-volatile memory cells 170 of the second region 160.

Meanwhile, when a normal command is input and an "H" MODE signal is input to each gate, the PMOS transistors turn OFF, and the NMOS transistors turn ON, connecting the first bit lines 140 to the non-volatile memory cells 170 of the second region 160. At this time, only the first word line 132 and the second word line 136 of the page to be accessed are activated by the row address buffer/decoder 220. As a result, the data is read out via the first bit lines 140 from the non-volatile memory cells 170 of the page to be accessed.

Flow of Control Data Read Out

Next, the process flow for reading out control data of the non-volatile memory area 115 will be described for the second embodiment, again using FIG. 4.

The control signal generator unit 310 and the row address buffer/decoder 220 receive the S-CMD input from the memory control unit 231, and activate the plurality of second word lines 136 at the same time as generating the "L" MODE signal. At this time, the S-CMD may include an address for activating specific second word lines 136, across a plurality of pages.

The word line switching units 134 receive the input of the "L" mode signal and deactivate the first word lines 132 of the first region 150. At this time, the second word lines 131, across a plurality of pages, are activated. When the "L" MODE signal is input, the bit line switching units 187 break the connection between the first bit lines 140 and the non-volatile memory cells 170 of the second region 160, and connect the second bit lines 142 to the non-volatile memory cells 170 of the second region 160. Furthermore, the selectors 182 of the bit line selection unit 180 receive the "L" MODE signal inputs so as to enable the read out of data from the second bit lines 142. In this way, the control data that is read out from the second bit lines 142 is output to the exterior of the non-volatile memory device 100 after being stored temporarily in the data buffer 200.

Consequently, the control data read out time can be reduced because the control data is read out across a plurality of pages at one time. Because of this, the time required for initialization, such as the time required for creating the address conversion table based on the control data, is reduced, thus reducing the time before it is possible to access the non-volatile memory device.

Third Embodiment

Constitution

Figure 6:
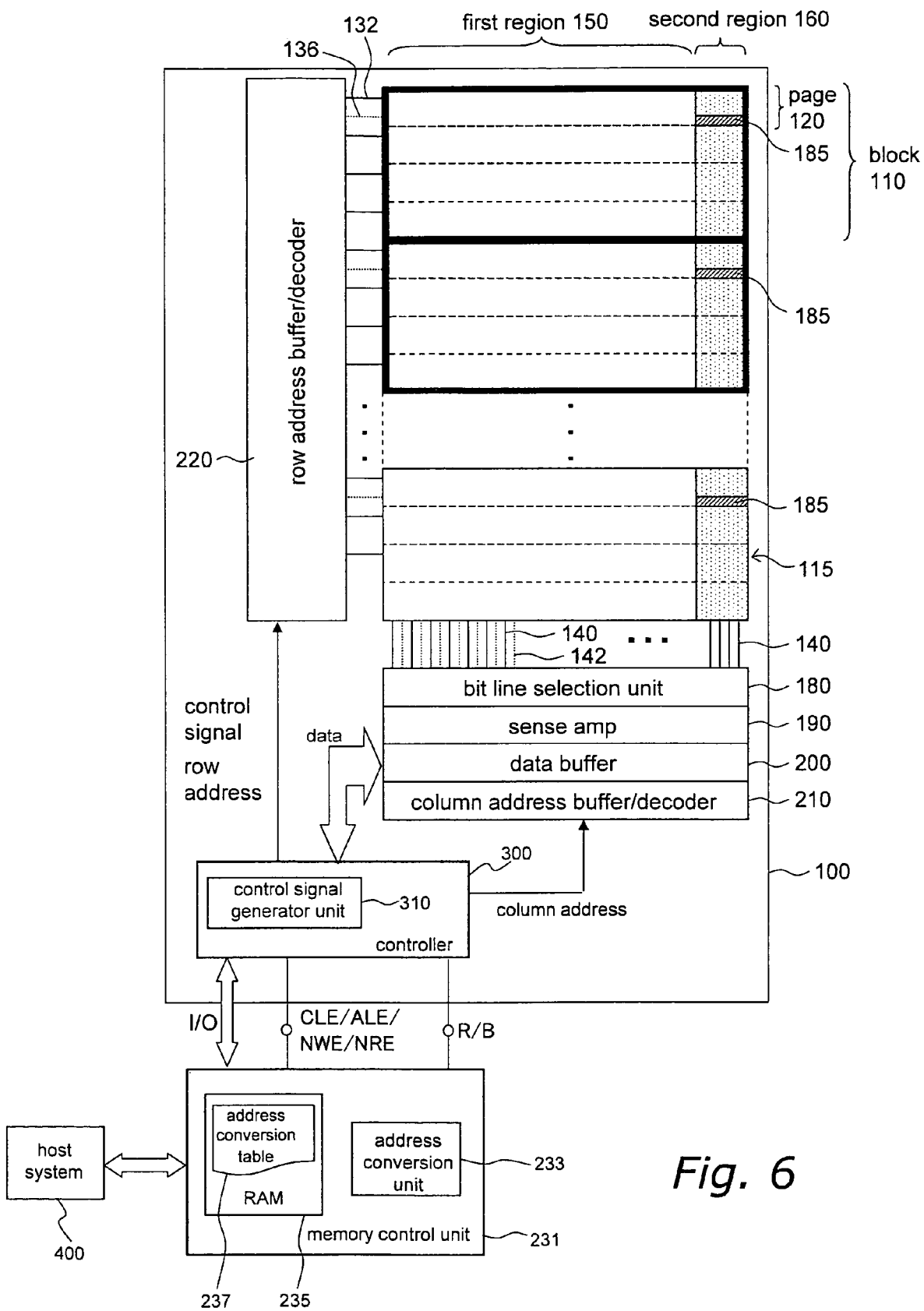
FIG. 6 is a block diagram of a non-volatile memory device according to a third embodiment.
Figure 7:
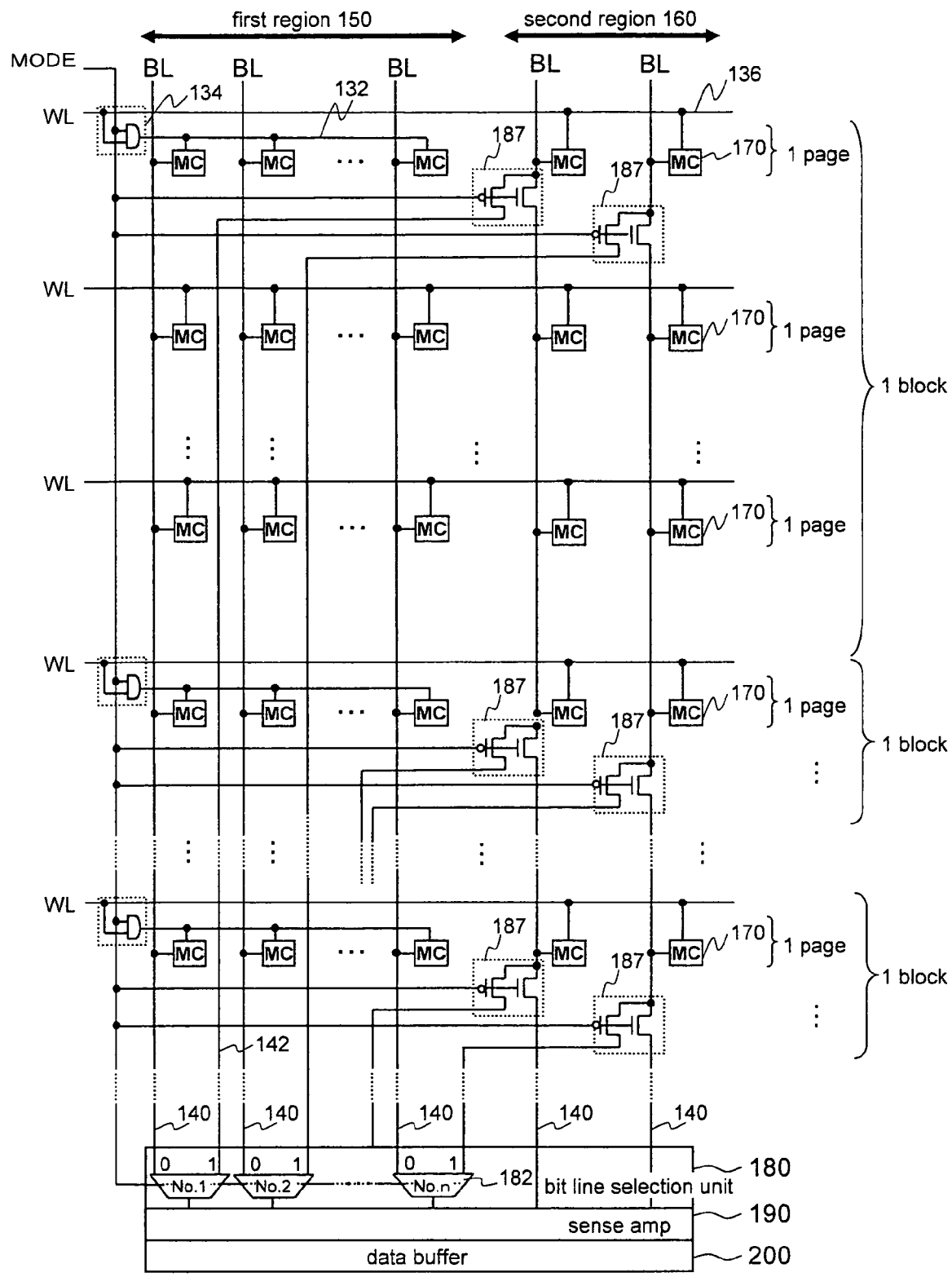
FIG. 7 is a block diagram of a non-volatile memory array and a bit line selection unit housed in a non-volatile memory device according to FIG. 6.

FIG. 6 is a block diagram of a non-volatile memory device according to a third embodiment, and FIG. 7 is a block diagram of a non-volatile memory array and bit line selection unit housed in the non-volatile memory device of FIG. 6.

As is shown in FIG. 6 and FIG. 7, the third embodiment differs from the second embodiment in that the word line switching units 134 and bit line switching units 187 are provided corresponding to the second region 160 located at the first page of each block. Additionally, the first region 150 at the first page of each block are connected to the first word line 132 that is the output of the word line switching units 134, and the second region 160 at the first page is connected to the second word line 136. Furthermore, in the pages other than the first page of each block, both the first region 150 and second region 160 are connected in common to the common word line 137. The other structures are the same as in the second embodiment, and descriptions thereof are omitted.

Flow of Control Data Read Out

Next, the flow of the process for reading out the control data of the non-volatile memory array 115 according to the third embodiment will be described, again using FIG. 4.

The control signal generator unit 310 and the row address buffer/decoder 220 receive the S-CMD input from the memory control unit 231 to generate an "L" MODE signal and activate the second word lines 136 corresponding to the first page of each of the plurality of blocks. The operations of the bit line switching units 187 and the selector 182 are the same as in the first embodiment. As a result, the control data for the second region 136 of a plurality of first pages can be read out at one time. In the case of the third embodiment, it is possible to read out only the second data of the plurality of second region 160 of the first pages at one time because the word line switching units 134 and bit line switching units 187 are provided at only the first page of each block.

Meanwhile, when accessing the second region 136 of pages other than the first page of each block, the common word lines 137 for each page are activated. The control data is read out from the second region 160 for each page.

As described above, when reading out the control data from the second region 160, structures capable of accessing the second region 160 across a plurality of pages may be mixed with structures able to access the second region 160 of each page. When accessing the second region 160 across a plurality of pages, it is possible to reduce the time required for reading the control data.

Fourth Embodiment

Constitution

Figure 8:
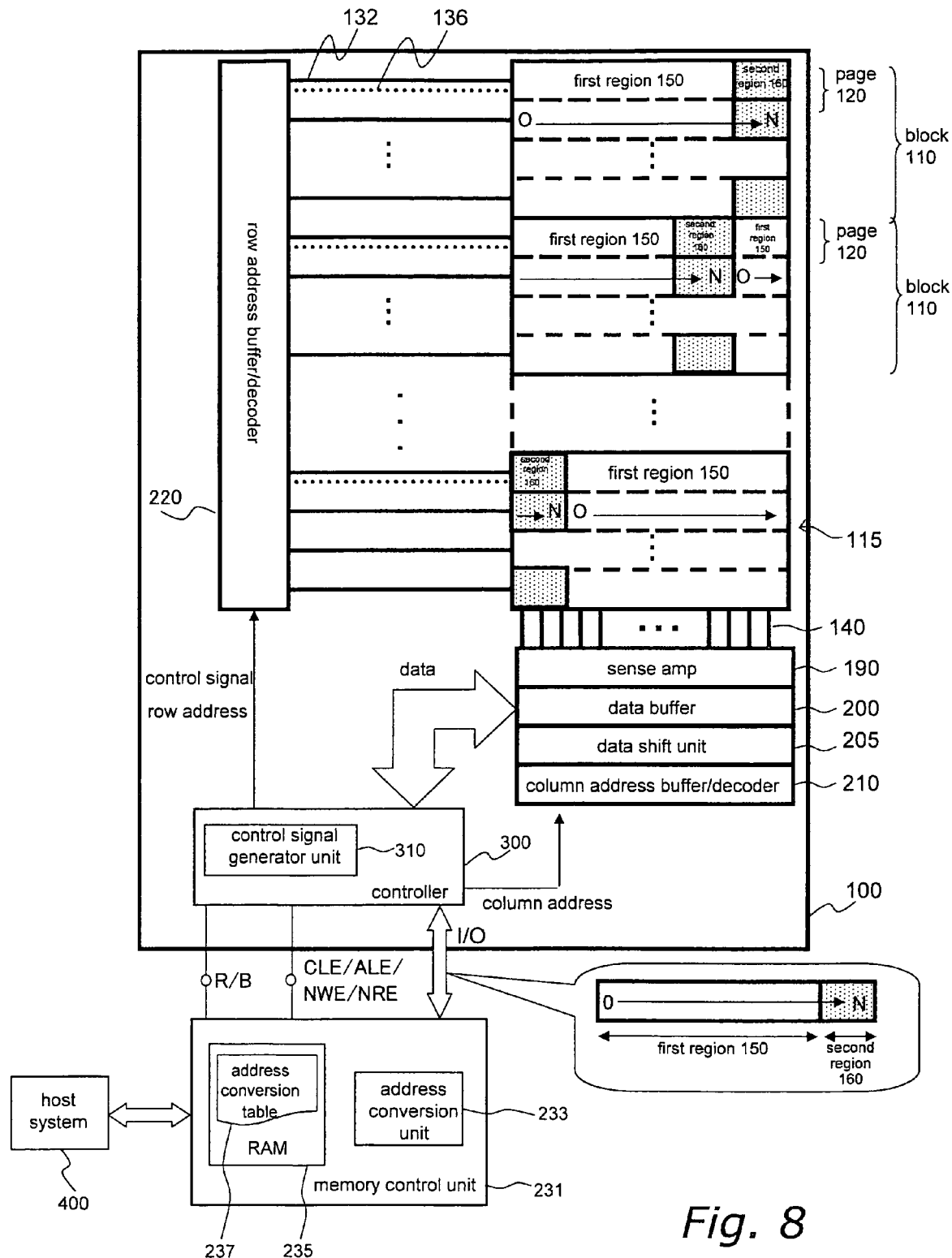
FIG. 8 is a block diagram of a non-volatile memory device according to a fourth embodiment.
Figure 9:
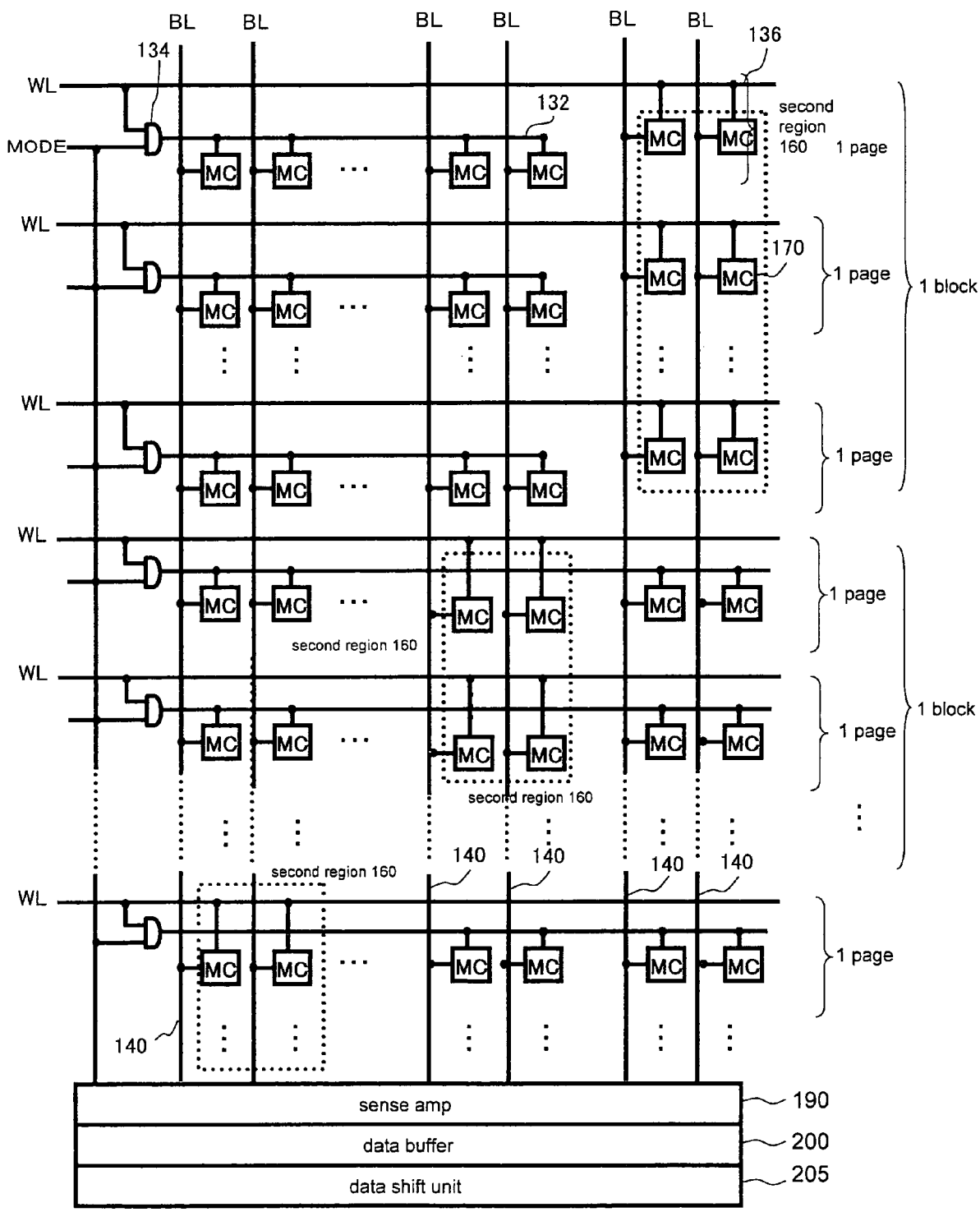
FIG. 9 is a block diagram of a non-volatile memory array housed in the non-volatile memory device in FIG. 8.

FIG. 8 is a block diagram of a non-volatile memory device according to a fourth embodiment, and FIG. 9 is a block diagram of a non-volatile memory array housed in the non-volatile memory device of FIG. 8. In the first through third embodiments, described above, the second regions 160 share the column addresses in the non-volatile memory array 115, or in other words, they were fabricated in the same positions in the column direction. Meanwhile, in the fourth embodiment, the second regions are provided at different positions for each block. In addition, a data shift unit 205 is provided in the fourth embodiment, but there are no bit line switching unit or bit line selection unit. The fourth embodiment is described below. Note that explanations are omitted for the structures that are identical to those in the first through third embodiments.

(1) Non-Volatile Memory Array

For the second regions 160, the layout is shifted for each block of the non-volatile memory array 115, so that the locations are such that the column addresses of the second regions 160 are different from block to block. In other words, the second regions 160 are connected by first bit lines 140 that are different for each block. For example, as shown in FIG. 8, even though the second region 160 in the first block is located on the right-hand edge of the non-volatile memory array 115, the second region 160 in the second block is located shifted one position to the left of the second region in the first block.

(2) Data Shift Unit

The non-volatile memory device 100 has a data shift unit 205. The data shift unit 205 shifts the position of the data input to the non-volatile memory device 100 in the non-volatile memory array 115.

The non-volatile memory device 100 receives, from the exterior, a page address and a block address along with the data to be written within the non-volatile memory cells. At this time, one page's worth of data input to the non-volatile memory device 100 is always arrayed in the same way regardless of the page address and the block address, such as shown by the callout at the I/O of FIG. 8. The data shift unit 205 interprets the amount to shift based on the page address and block address that are input along with the data, and shift the data. Note that the data shift unit 205 stores the amount to be shifted for each block. When reading out data, the data that has been read out is shifted in the other direction based on the page address and block address of the read out data to restore the shifted data to the original position. In other words, the layout of the data that is handled in the I/O is always the same.

More specifically, with reference to FIG. 8, when a logical address is input from the host system 400 for accessing the non-volatile memory cells, first the address conversion unit 233 of the memory control unit 231 converts the logical address to a physical address based on the address conversion table 237. When the address is input along with data into the non-volatile memory device 100 from the I/O, the data shift unit 205 performs data shifting as follows. When writing data to the first block, the beginning of the first region 150 of the first block (No. 0 in the figure) is positioned at the left-hand edge of the non-volatile memory array 115, and the data is shifted so as to increase the physical address sequentially towards the right. Furthermore, when writing data to the No. 2 block, the beginning of the first region 150 of the No. 2 block (No. 0 in the figure) is positioned corresponding to the second region 160 of the No. 1 block, the physical address increasing towards the right, and when the right-hand edge has been reached, the data being shifted so that the physical address begins at the left-hand edge and increases towards the right.

Flow of Control Data Read Out

Next, the flow of the process for reading out the control data for the non-volatile memory array 115 according to a fourth embodiment will be described, again using FIG. 4.

The control signal generator unit 310 and the row address buffer/decoder 220 receive, from the memory control unit 231, an S-CMD for reading out the second region 160, and both generate an "L" MODE signal and generate a signal for activating the plurality of second word lines 136.

The word line switching units 134 receive the "L" MODE signal to deactivate the first word lines 132 of the first region 150. For example, as is shown in FIG. 9, the word line switching units 134 comprise an AND gate, where the first word lines 132 are deactivated when the "L" MODE signal is input. Here, in the second regions 160 in a given block, the first bit lines 140 are shared, where the first bit lines 140 that connect to the respective second regions 160 are different in different blocks. Consequently, the row address buffer/decoder 200 activates one second word line 136 for each block based on the S-CMD, activating at one time second word lines 136 for a plurality of pages across a plurality of blocks. At this time, the S-CMD may include an address that specifies which plurality of second word lines 136 are to be activated for which blocks. The control data that is read out from the first bit lines 140 in this way is output to the exterior of the non-volatile memory device 100 after being stored temporarily in the data buffer 200.

Note that the word line switching units 134 need only control the active/inactive states of the first word lines 132 and second word lines 136, and are not limited to AND gates.

By reading out the control data from the second regions 160 across a plurality of blocks by shifting the positions of the second region 160 for each block, in this manner, the need to provide the bit line switching units, bit line selection unit, and second bit lines shown in the first embodiment is eliminated, making it possible to reduce the size of the non-volatile memory device. Furthermore, the time required for initialization, such as the creation of address conversion tables based on control data, is reduced, thus reducing the time before it is possible to access the non-volatile memory device. Note that even in the case wherein control data is read out from second regions across a plurality of pages, as described above, the control data is read from different first bit lines, and thus no collisions occur in the control data.

Fifth Embodiment

Constitution

Figure 10:
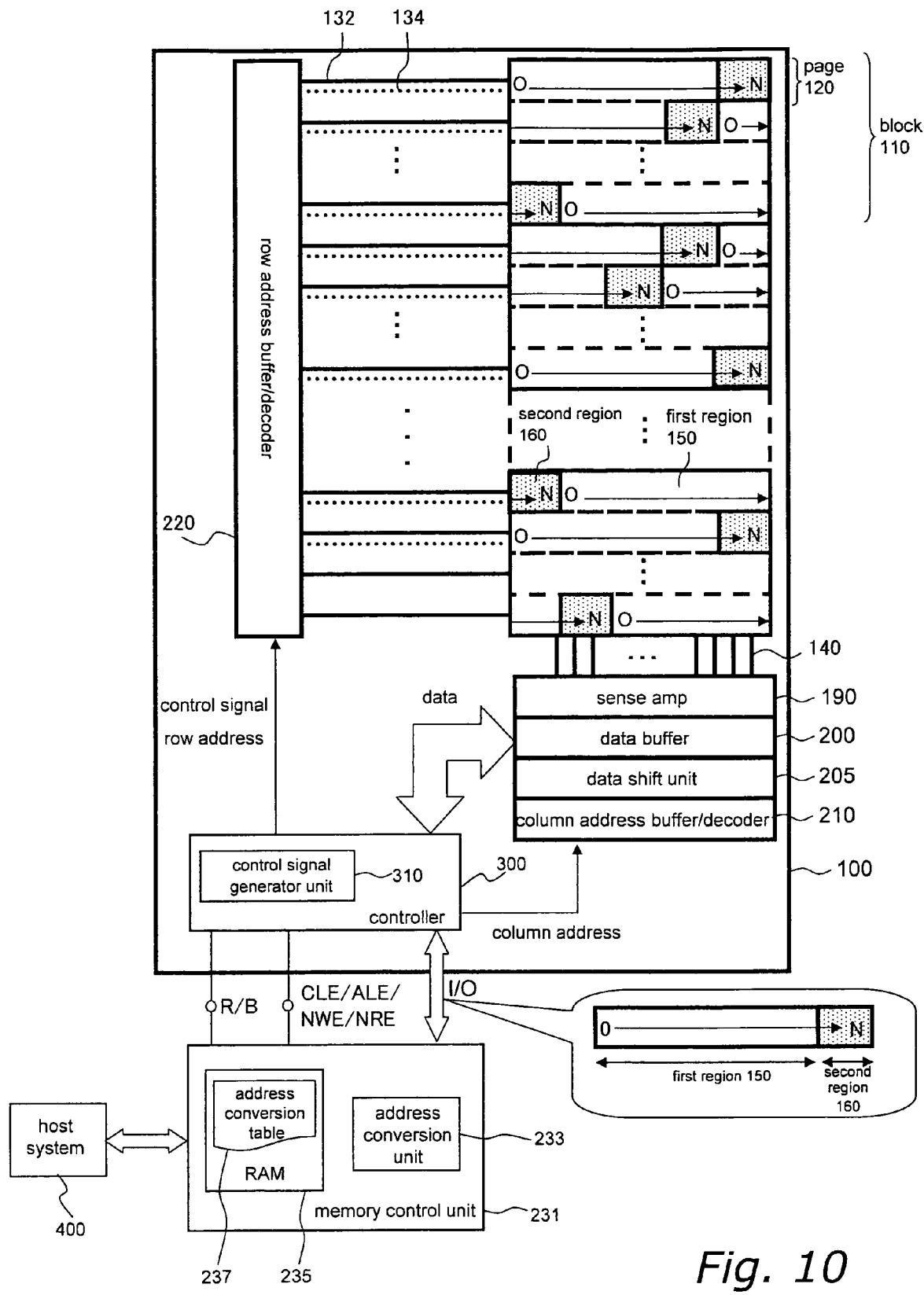
FIG. 10 is a block diagram of a non-volatile memory device according to a fifth embodiment.
Figure 11:
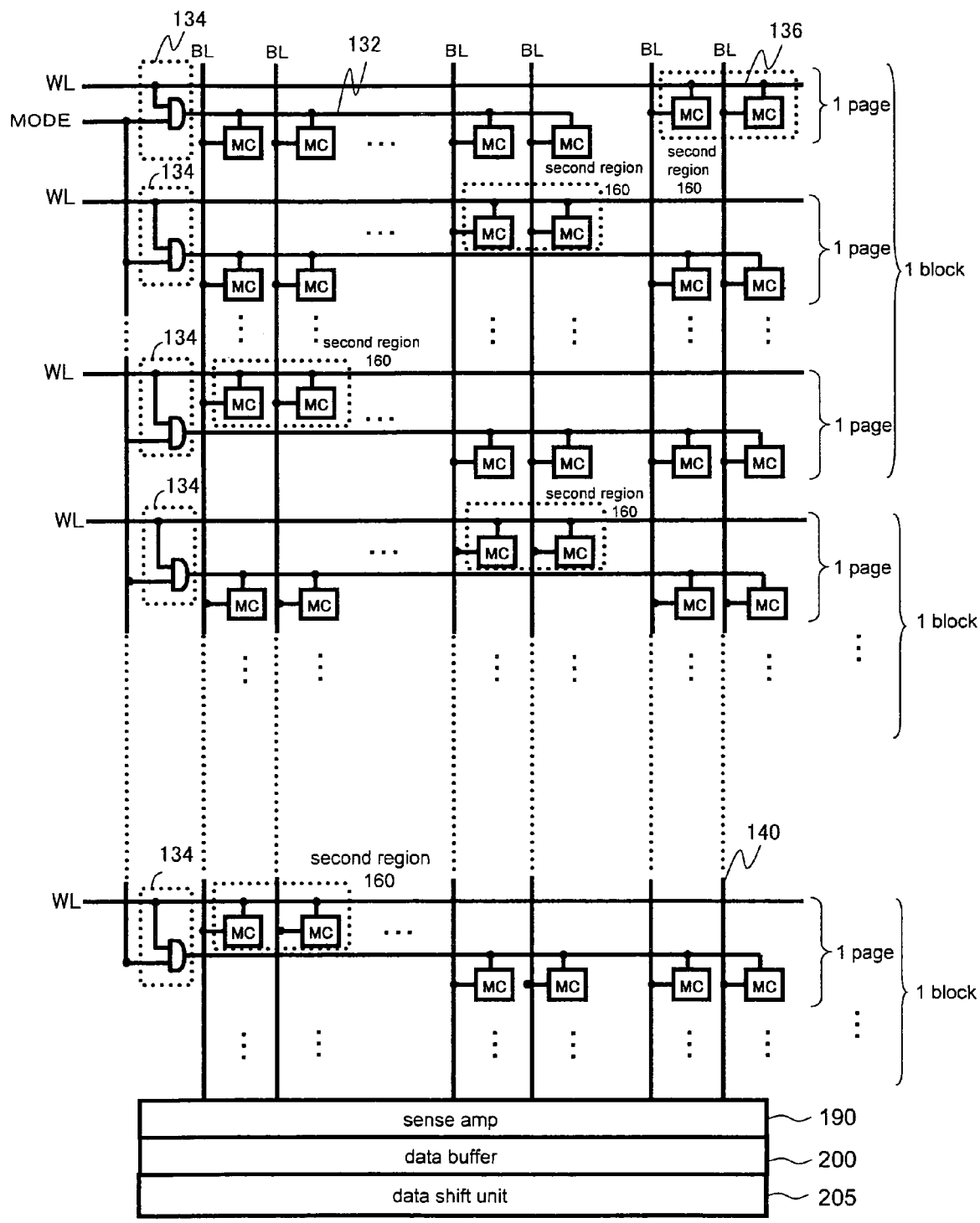
FIG. 11 is a block diagram of a non-volatile memory array housed in the non-volatile memory device in FIG. 10.

FIG. 10 is a block diagram of a non-volatile memory device according to a fifth embodiment, and FIG. 11 is a block diagram of a non-volatile memory array housed in the non-volatile memory device of FIG. 10. In the fourth embodiment, described above, the second regions 160 were disposed in different positions in each block. Meanwhile, in the fifth embodiment, the second regions are disposed in different positions on each page. Furthermore, in the fifth embodiment, the bit line switching units and bit line selection unit are similarly absent. The fifth embodiment will be described below. Note that descriptions are omitted for structures that are identical to those in the fourth embodiment.

(1) Non-Volatile Memory Array

For the second regions 160, the positions are shifted for each page in the non-volatile memory array 115 to positions that have different column addresses for the second region 160 from page to page. In other words, the second regions 160 are connected to first bit lines 140 that are different for each page. For example, as shown in FIG. 11, the second region 160 is positioned at the right-hand edge of the non-volatile memory array 115 for the first page of the first block, but for the second page, the second region 160 is positioned shifted to the left by one beyond the second region 160 of the first page.

Here, the second regions of all of the pages may be formed so as to be different, or the positions of the second region may be different for each page within a block.

(2) Data Shift Unit

The non-volatile memory device 100 in the fifth embodiment has a data shift unit 205 that is the same as in the fourth embodiment.

More specifically, with reference to FIG. 10, when an address is input along with fixed position data from the I/O into the non-volatile memory device 100, the data shift unit 205 shifts the data as follows.

When writing data to the first page of the first block, the data is shifted so that the second region 160 will be positioned at the right-hand edge in the non-volatile memory array 115. More specifically, the beginning of the first region 150 (No. 0 in the figure) is positioned at the left-hand edge of the non-volatile memory array 115, and the physical addresses are shifted sequentially so as to increase towards the right. When writing data to the second page of the first block, the data is shifted so that the second region 160 will be positioned one to the left of the second region of the first page. More specifically, in the second page the beginning of the first region 150 (No. 0 in the figure) is positioned so as to correspond with the second region 160 of the first page, the physical address thereof increasing towards the right, and if the right-hand edge is reached, the physical addresses being shifted, beginning with the left-hand edge, increasing towards the right.

Flow of Control Data Read Out

The process flow for reading out the control data of the non-volatile memory array 115 for the fifth embodiment will be described next, again using FIG. 4.

The word line switching units 134 comprises, for example, an AND gate, as shown in FIG. 11, where an "L" MODE signal input is received from the control signal generator unit 310 and the row address buffer/decoder 220 to deactivate the first word lines 132 of the first region 150. Here, the non-volatile memory cells in the second region 160 in the same block are connected to first bit lines 140, which are different for each page. As a result, the row address buffer/decoder 220 activates, at one time, second word lines 136, across a plurality of pages, within a single block based on the S-CMD for reading out the second regions 160. Thus, a plurality of second word lines 136 are activated sequentially by the single block unit. Here, the S-CMD may include an address for activating a plurality of second word lines 136 within a specific block. The control data that is read out by the activated second word lines 136 and first bit lines 140 is output to the exterior of the non-volatile memory device 100 after being stored temporarily in the data buffer 200.

In this way, the positions of the second region 160 are shifted for each page within the block, to read out the control data from the second regions 160 across a plurality of pages within a block, thus eliminating the need for the provision of the bit line switching units, bit line selection unit, and second bit lines shown in the first embodiment, making it possible to reduce the size of the non-volatile memory device. Furthermore, this reduces the time required for initialization, such as generating the address conversion table based on the control data, thus reducing the time required before it is possible to access the non-volatile memory device. Note that even when the control data is read out from the second region, across a plurality of pages, as described above, the control data is read from different first bit lines, and thus there are no collisions in the control data.

Sixth Embodiment

Constitution

Figure 12:
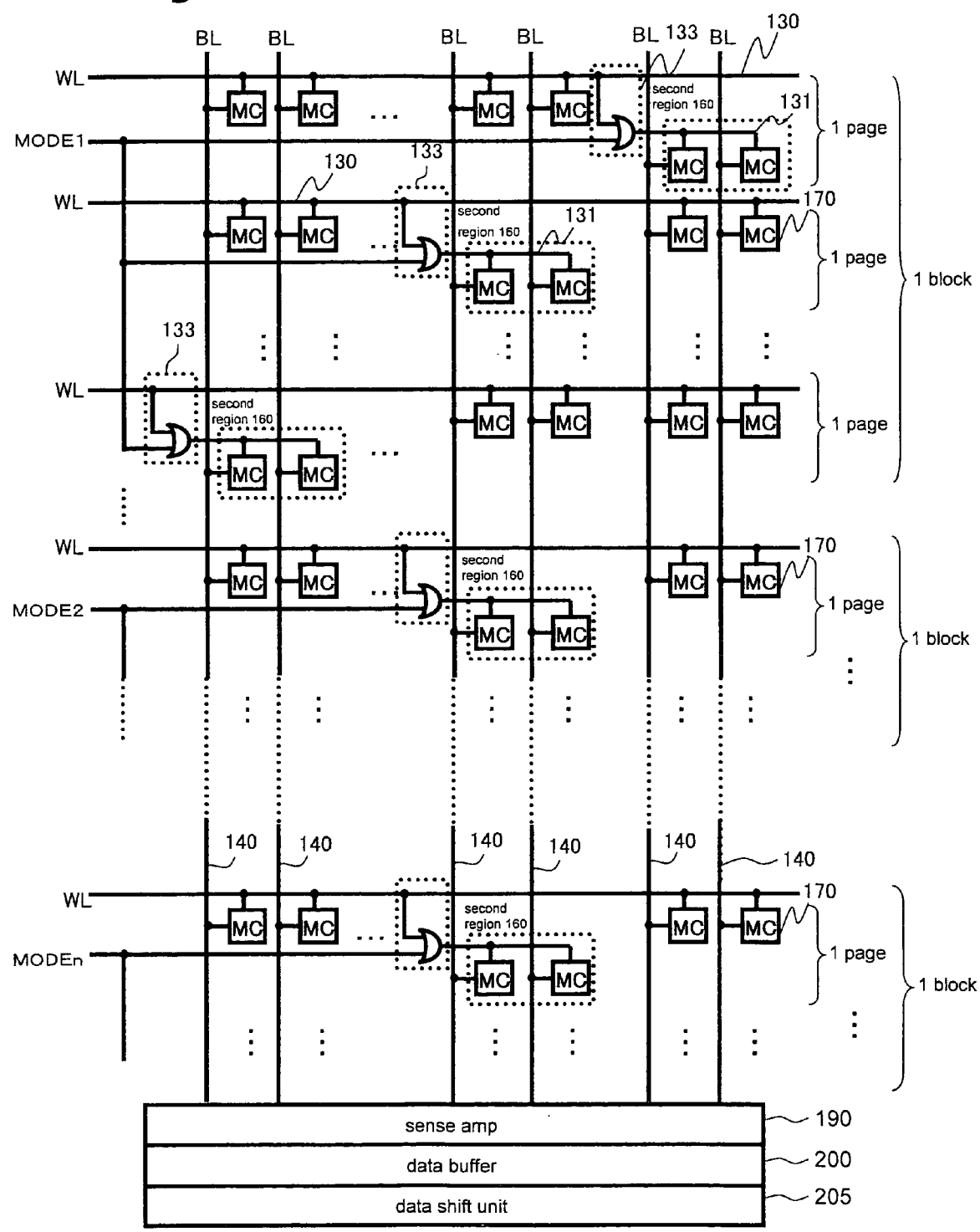
FIG. 12 is a block diagram of another non-volatile memory array housed in a non-volatile memory device according to the fifth embodiment in FIG. 10.

FIG. 12 is a block diagram showing another non-volatile memory array housed in a non-volatile memory device according to the fifth embodiment in FIG. 10.

In the sixth embodiment, the positions of the second regions 160 are shifted in the non-volatile memory array 115 in the same manner as in the fifth embodiment, and OR gates are used as the word line switching units 133 in the same manner as in the first embodiment. The first word lines 130, connected to the first region 150, and the MODE signals (MODE 1, MODE 2, and so forth, in FIG. 12) are connected to the inputs of the word line switching units 133, and the second word lines 131, which are connected to the second region 160, are connected to the outputs thereof. Furthermore, the MODE signals, which are different for each block, which is to say, MODE 1 for the first block, MODE 2 for the next block, and so forth, are input to the word line switching units 133. Inputting MODE signals that differ in this way can prevent collisions in the data that is read out from the non-volatile memory cells in the second region 160. Furthermore, the non-volatile memory cells in the second regions 160 share the first bit lines 140 between different blocks, as shown in FIG. 12. Descriptions are omitted for other structures that are the same as in the first or fifth embodiments.

Flow of Control Data Read Out

Next, the process flow for reading out the control data from the non-volatile memory array 115 will be described for the sixth embodiment, again using FIG. 4.

The control signal generator unit 310 and the row address buffer/decoder 220 receive the S-CMD input for reading out the second region 160 from the memory control unit 231 to generate the "H" MODE signals. The row address buffer/decoder 220 receives the S-CMD input to activate the second word lines 131, across a plurality of pages, for each block unit so as to activate the block units sequentially. At this time, the S-CMD may include an address that specifies the plurality of pages for which specific blocks are to be activated.

The word line switching units 133 comprise, for example, an OR gate as shown in FIG. 12, and when an "H" MODE signal input is received, the second word lines 131 of the second regions 160, across a plurality of pages, are activated regardless of the input from the first word lines 130. Consequently, the control data is read out to the sense amp 190 via the first bit lines 140 corresponding to the respective second regions 160, across a plurality of pages, and is output to the exterior of the non-volatile memory device after being stored temporarily in the data buffer 200.

The structure described above can provide the same effects as those of the fifth embodiment.

Seventh Embodiment

Figure 13:
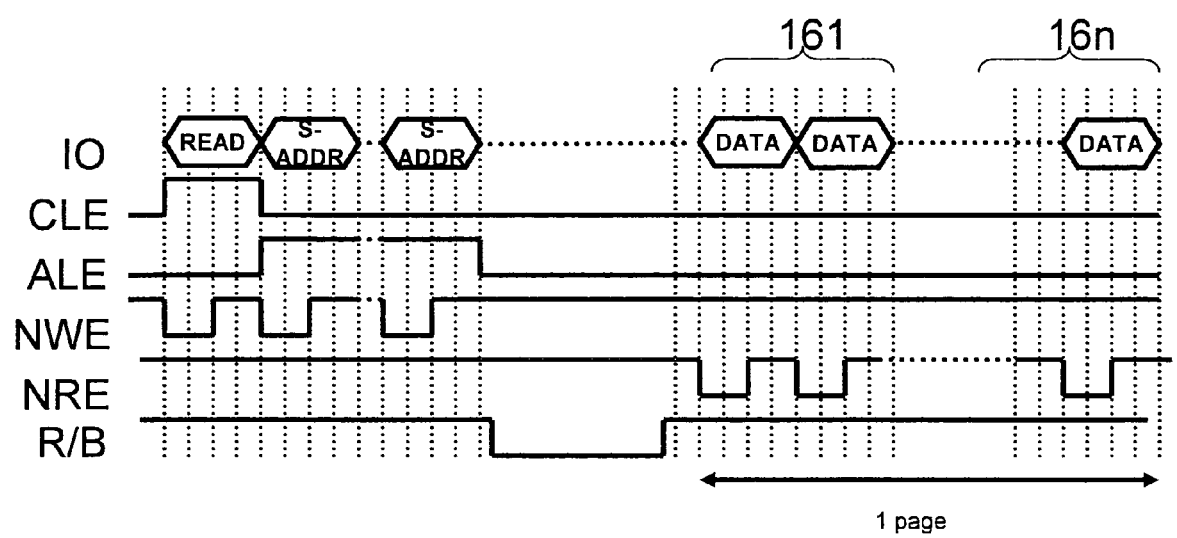
FIG. 13 is an example of a timing chart for reading out control data from the non-volatile memory device 100.

In the seventh embodiment, a different process flow is described for reading out the control data. FIG. 13 is an example of a timing chart for reading out control data from a non-volatile memory device 100 by inputting a READ command and a plurality of addresses. A different process flow for reading out control data using the non-volatile memory device 100 of FIG. 5, which illustrates the second embodiment, will be described.

When reading out the control data, the memory control unit 231 first inputs, along with an external signal CLE, a READ command for a normal page read. Next, a plurality of desired addresses S-ADDR are input, along with the external signal ALE. Here, when the external signal NRE changes, after the R/B signal has changed from low to high, the control data is read out from the second region 160, which span a plurality of pages of the non-volatile memory array 115.

Specifically, when reading out control data, the control signal generator unit 310 and the row address buffer/decoder 220 generate the "L" MODE signals from the READ command that has been received, where these MODE signals are input to the word line switching units 134, the bit line switching units 187, and the selectors 182 of the bit line selection unit 180. Furthermore, the row address buffer/decoder 220 decodes the address after the conversion of the input address, and activates the corresponding second word lines 136. At this point, the row address buffer/decoder 220 activates second word lines 136 for a plurality of pages, corresponding to the plurality of input addresses, as shown in FIG. 13. The word line switching units 134 are provided for each page, and receive the "L" MODE signals that have been generated, to deactivate the first word lines 132 in the first region.

The bit line switching units 187 and selectors 182 of the bit line selection unit 180 receive the input of the "L" MODE signals and enable reading out of the data from the second bit lines 142. The control data is read out to the selectors 182 via the second bit lines 142 that correspond, respectively, to the second region 160, across a plurality of pages, and is stored temporarily in the data buffer 200.

In this way, the time for reading the control data can be reduced because the control data is read out at one time across a plurality of pages. Inputting addresses along with inputting commands enables the reading out of the second region 160 for each block, and the reading out the second region 160 specified by the addresses. Similarly in the aforementioned first and third through sixth embodiments, the control data can be read out in accordance with the read out process flow of the seventh embodiment illustrated in FIG. 13. For example, in the third embodiment, illustrated in FIGS. 6 and 7, only the plurality of first pages of each block are activated by the address specification. In the fourth embodiment in FIG. 8 and FIG. 9, one page from each block is activated, across a plurality of blocks, by the address specification. In the fifth and sixth embodiments illustrated in FIGS. 10 through 12, a plurality of pages within a block, for each block, are activated by the address specification.

Specifying addresses in this way make it possible to adjust the size of the control data that is read out from the second region.

Eighth Embodiment

Figure 14:
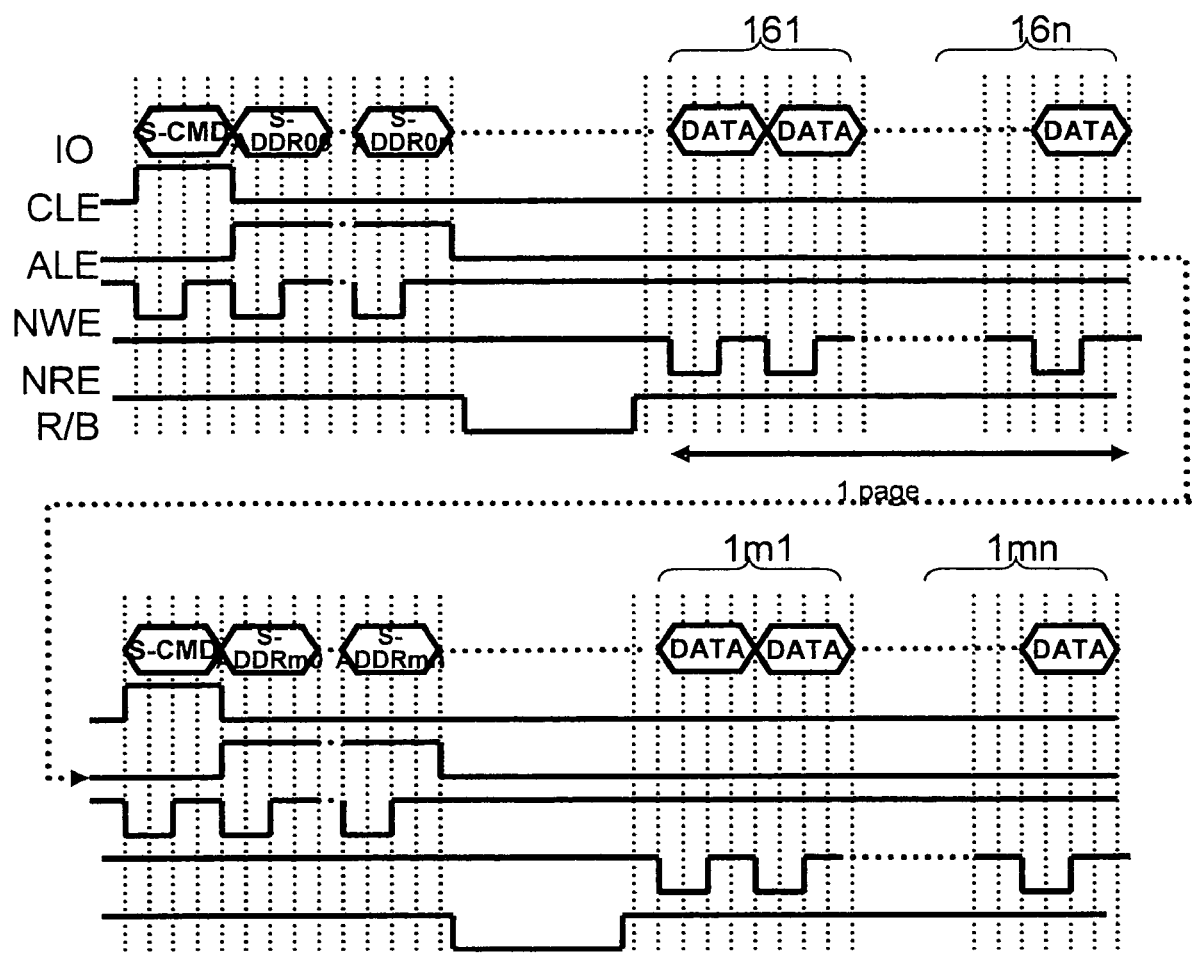
FIG. 14 is another example of a timing chart for a case in which control data is read out from the non-volatile memory device 100.

Yet another process flow for reading out control data will be described in an eighth embodiment. FIG. 14 is another timing chart for a case wherein control data is read out from the non-volatile memory device 100 through inputting the S-CMD and a plurality of addresses for reading out the second region 160. A different control data read out process flow will be described using, for example, the non-volatile memory device 100 of FIG. 5, which illustrates the second embodiment.

When the memory capacity of the non-volatile memory device 100 is increased, the number of pages is increased, and it may not be possible to read out all of the required control data of the second region 160 with a single command input.

Thus, when reading out the control data, the memory control unit 231 first inputs the S-CMD along with the external signal CLE. Next, the addresses S-ADDR00 through SADDR0$n$, for specifying a plurality of pages that include the desired second region 160, are input along with the external signal ALE. When the external signal NRE has a transition after the R/B signal has changed from low to high, the control data is read out from the second region 160 of the non-volatile memory array 115. Here, the control data of the second region 161 through 161$n$ is read out in the first read process. Following this, the addresses S-ADDRm0 through SADDRmn, which include the desired second region, are input similarly. This enables the reading out of the control data of the second region 1$m$0 through 1$mn$ as shown in FIG. 14. In this way, when it is not possible to read out all of the control data in a single cycle, or in other words, when the volume of the control data that must be read out exceeds the capacity of the data buffer 200, it is possible to split the read out into several cycles, as shown in FIG. 14. By repeatedly inputting addresses with commands in this way, it is possible to read out the control data of the second region 160 over a plurality of cycles.

It is also possible to read out the control data using the read out process flow shown in FIG. 14 in the eighth embodiment in the same manner, for the first and third through sixth embodiments, described above.

Figure 15:
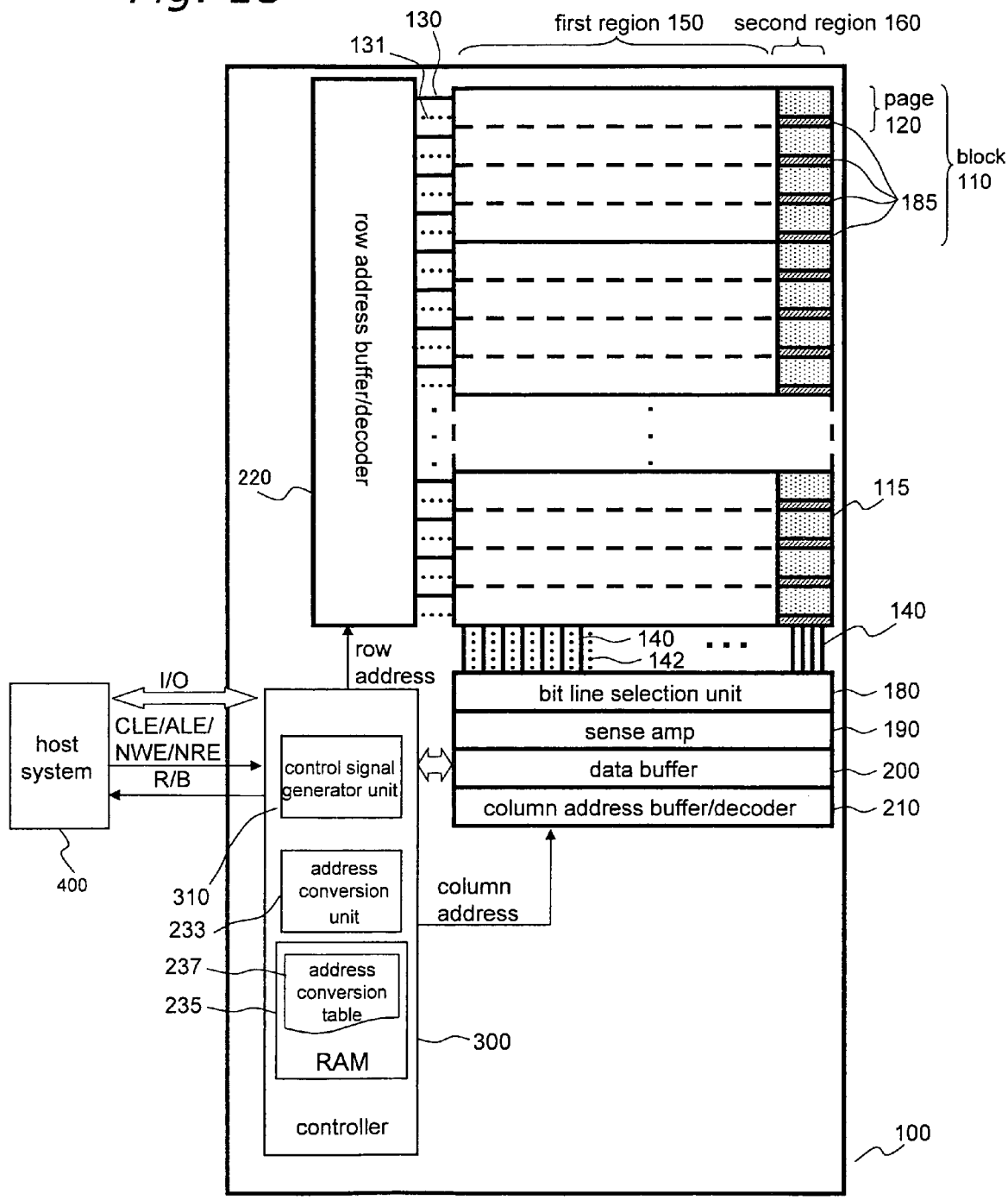
FIG. 15 is another block diagram of a non-volatile memory device.

Other Embodiments (A) In the embodiments described above, the address conversion unit 233, the RAM 235, and the address conversion table 237 are provided within the memory control unit 231, which is external to the non-volatile memory device 100. The address conversion unit 233, RAM 235, and address conversion table 237 may instead be provided within the non-volatile memory device 100, as shown in FIG. 15.

In such a case, the control data of the second region 160 will be read out when the non-volatile memory device 100 is powered up. The controller 300 that is internal to the non-volatile memory device 100 generates an address conversion table for converting addresses, based on this control data, and stores the address conversion table in the RAM 235. When data is read or written, the address conversion unit 233 converts the addresses based on the address conversion table.

(B) In the embodiments described above, the non-volatile memory cells in the first region 150 and the second region 160 are connected to different word lines. For example, the first region 150 of the non-volatile memory device 100 in FIG. 1 are connected to the first word lines 130, and the second region 160 are connected to the second word lines 131. When reading out the control data of the second region 160, the corresponding second word lines 131 are activated. At this time, the first word lines 130 go into an inactive state. However, the structure may instead be one wherein the first region 150 and the second region 160 are connected with common word lines.

In this case, when reading out the control data from the second region 160, the corresponding word lines are activated to read out the control data from the second region 160 through the corresponding second bit lines. At this time, the word lines for the first region 150, which are connected to the common word lines, are also activated because the first region 150 and the second region 160 are connected to common word lines. However, when reading out the control data from the second region 160, the first bit lines 140 of the first region 150 are not selected, and so the data is not read out from the first region 150. Sharing the word lines, as described above, can simplify the structure. Furthermore, the structure is simple in that there is no need for the word line switching units 133 to activate either the first word lines 130 or the second word lines 131.

INDUSTRIAL APPLICABILITY

The non-volatile memory device according to the present invention has a structure which reduces the time required for the initialization process when powering up, and is useful as a memory for an external memory device such as a memory card. It can also be applied to the use of a memory device housed in an audiovisual apparatus such as a digital camera.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing description of the embodiments according to the present invention are provided for illustration only, and not for the purpose of limiting the invention as defined by the appended claims and their equivalents.

What is claimed is:

1. A non-volatile memory device, comprising:
 a non-volatile memory array that includes a plurality of pages, each of the pages having a plurality of non-volatile memory cells located in a first region and which store data, and another plurality of non-volatile memory cells located in a second region and which store control data associated with the data;
 a plurality of first word lines, each of the first word lines being connected to a row of the non-volatile memory cells located in the first region of a respective one of the plurality of pages;
 a plurality of second word lines, each of the second word lines being connected to a row of the non-volatile memory cells located in the second region of a respective one of the plurality of pages;
 a read out unit configured to read out data from the plurality of pages; and
 a data buffer configured to temporarily store data that has been read out from the pages by the read out unit;
 wherein the read out unit when reading out the control data, uses the second word lines but does not use the first word lines, so as to read out the control data from the second regions across two or more of the plurality of pages at one time without accessing the first regions across the two or more of the plurality of pages.

2. The non-volatile memory device recited in claim 1, wherein
 the non-volatile memory device further comprises bit lines for connecting the read out unit with the non-volatile memory cells in the first and second regions; and
 the non-volatile memory cells in the second regions across the plurality of pages are connected by mutually different bit lines.

3. The non-volatile memory device recited in claim 1, further comprising a memory control unit configured to create an address conversion table for assigning a correspondence between a logical address input from a system for controlling the non-volatile memory device, and a physical address of the non-volatile memory array, based on the control data in the second regions that was read out at one time by the read out unit across the two or more of the plurality of pages.

4. The non-volatile memory device recited in claim 3, wherein the memory control unit converts a logical address that is input to access the non-volatile memory device into a physical address, based on the address conversion table.

5. The non-volatile memory device recited in claim 1, wherein:
 the non-volatile memory device further comprises a plurality of second bit lines connected to the non-volatile memory cells in the second regions across the plurality of pages; and
 the read out unit, when reading out the control data, reads out the control data from the non-volatile memory cells in the second regions across the two or more of the plurality of pages via corresponding ones of the second bit lines.

6. The non-volatile memory device recited in claim 5, further comprising:
 a plurality of first bit lines, each of the first bit lines being connected to a respective column of the non-volatile memory cells located in the first and second regions; and
 word line selection units configured to activate the first word lines and the second word lines on a page-by-page basis when the data stored in the first regions is to be read out, and configured to activate the second word lines, and inactivate the first word lines, across the two or more of the plurality of pages when the control data stored in the second regions is to be read out; wherein:
 the read out unit comprises a bit line selection unit configured to select a plurality of the first bit lines and read out data via the plurality of the first bit lines from the non-volatile memory cells located in the first region and the second region of one of the pages when the data stored in the first region is to be read out, and configured to select a plurality of the second bit lines and read out control data via the plurality of the second bit lines from the non-volatile memory cells located in the second regions across the two or more of the plurality of pages when the control data stored in the second regions is to be read out.

7. The non-volatile memory device recited in claim 1, wherein:
 the non-volatile memory cells in the first and second regions are disposed in the form of a matrix;
 the non-volatile memory device further comprises a plurality of first bit lines, each of the first bit lines being connected to non-volatile memory cells that are disposed in a column direction in the first and second regions; and
 the non-volatile memory cells in the second regions across the plurality of pages are connected to mutually different first bit lines.

8. The non-volatile memory device recited in claim 7, further comprising:
 word line selection units configured to activate the first word lines and the second word lines on a page-by-page basis when the data stored in the first regions is to be read out, and configured to activate the second word lines, and inactivate the first word lines, across the two or more of the plurality of pages when the control data stored in the second regions is to be read out;
 wherein the read out unit comprises a bit line selection unit configured to select a plurality of the first bit lines and read out data from the non-volatile memory cells located in the first region and the second region of one of the pages via the plurality of the first bit lines when the data stored in the first region is to be read out, and configured to select a plurality of the first bit lines and read out control data via the plurality of the first bit lines from the non-volatile memory cells located in the second regions across the two or more of the plurality of pages when the control data, stored in the second regions is to be read out.

9. The non-volatile memory device recited in claim 6, wherein each of the word line selection units comprises a word line switching unit configured to receive a signal from a corresponding one of the first word lines, to receive a control signal for selecting word lines, the control signal being generated by commands for reading out the control data, and to output a signal for determining activity/inactivity of the second word lines.

10. The non-volatile memory device recited in claim 6, wherein each of the word line selection units comprises a word line switching unit configured to receive a control signal for selecting word lines, the control signal being generated by commands for reading out the control data, to receive a signal from a corresponding one of the second word lines and to output a signal for determining activity/inactivity of the first word lines.

11. The non-volatile memory device recited in claim 6, wherein:
the non-volatile memory device further comprises bit line switching units provided between the non-volatile memory cells in the second regions and the first and second bit lines; and
the bit line switching units are configured to connect the non-volatile memory cells in the second regions to corresponding second bit lines when a command to read out the control data is input, and to connect the non-volatile memory cells in the second regions to corresponding first bit lines when the command is not input.

12. The non-volatile memory device recited in claim 11, wherein each of the bit line switching units comprises a first switching element and a second switching element, the first switching element and the second switching element having mutually different polarities.

13. The non-volatile memory device recited in claim 6, wherein:
the non-volatile memory array further comprises a plurality of blocks, each of the blocks being a data erase unit and each of the blocks including a plurality of the pages;
the word line selection units activate a plurality of the second word lines connected to the non-volatile memory cells in the second regions within a single one of the blocks when reading out the control data; and
the bit line selection unit reads out the control data via a plurality of the second bit lines from the second regions within the one of the blocks.

14. The non-volatile memory device recited in claim 6, wherein:
the non-volatile memory array further comprises a plurality of blocks, each of the blocks being a data erase unit, and each of the blocks including a plurality of the pages;
the word line selection units activate, in each of the blocks, any of the second word lines connected to the non-volatile memory cells in the second regions when reading out the control data; and
the bit line selection unit reads out the control data via corresponding ones of the second bit lines from any one of the second regions in each of the blocks.

15. The non-volatile memory device recited in claim 1, wherein a command is provided for reading out, at one time, the control data from the second regions across the two or more of the plurality of pages.

16. The non-volatile memory device recited in claim 15, wherein:
the non-volatile memory array comprises a plurality of blocks, each of the blocks being a data erase unit, and each of the blocks including a plurality of the pages; and
the command instructs the read out unit to read out, at one time, the control data from the second regions within one of the blocks across the two or more of the plurality of pages, or to read out, at one time, the control data from the second regions within different blocks across the two or more of the plurality of pages.

17. The non-volatile memory device recited in claim 8, wherein each of the word line selection units comprises a word line switching unit configured to receive a signal from a corresponding one of the first word lines, to receive a control signal for selecting word lines, the control signal being generated by commands for reading out the control data, and to output a signal for determining activity/inactivity of the second word lines.

18. The non-volatile memory device recited in claim 8, wherein each of the word line selection units comprises a word line switching unit configured to receive a control signal for selecting word lines, the control signal being generated by commands for reading out the control data to receive a signal from a corresponding one of the second word lines, and to output a signal for determining activity/inactivity of the first word lines.

19. The non-volatile memory device recited in claim 1, wherein each of the second word lines is separated from the non-volatile memory cells located in the first region of a respective one of the plurality of pages.

* * * * *